United States Patent
Yu et al.

(10) Patent No.: US 8,705,239 B1
(45) Date of Patent: *Apr. 22, 2014

(54) HEAT DISSIPATION FOR ELECTRONIC MODULES

(75) Inventors: Enchao Yu, Irvine, CA (US); Zhiyong An, Irvine, CA (US)

(73) Assignee: Netlist, Inc., Irvine, CA (US)

(*) Notice: Subject to any disclaimer, the term of this patent is extended or adjusted under 35 U.S.C. 154(b) by 75 days.

This patent is subject to a terminal disclaimer.

(21) Appl. No.: 13/205,477

(22) Filed: Aug. 8, 2011

Related U.S. Application Data

(63) Continuation of application No. 12/432,591, filed on Apr. 29, 2009, now Pat. No. 8,018,723.

(60) Provisional application No. 61/049,153, filed on Apr. 30, 2008.

(51) Int. Cl.
 *H05K 7/20* (2006.01)
 *H01L 23/36* (2006.01)

(52) U.S. Cl.
 USPC ............ 361/715; 361/710; 361/720; 361/709; 361/711; 257/707

(58) Field of Classification Search
 USPC ......... 361/702, 707, 709–711, 715, 719, 720; 257/707
 See application file for complete search history.

(56) References Cited

U.S. PATENT DOCUMENTS

| | | | |
|---|---|---|---|
| 3,268,772 A | 8/1966 | Kamei et al. | |
| 3,893,161 A | 7/1975 | Pesak | |
| 4,535,385 A | 8/1985 | August et al. | |
| 4,628,407 A | 12/1986 | August et al. | |
| 4,849,858 A | 7/1989 | Grapes et al. | |
| 4,867,235 A | 9/1989 | Grapes et al. | |
| 4,872,505 A | 10/1989 | Jones et al. | |
| 4,887,353 A | 12/1989 | Preputnick | |
| 5,060,113 A | 10/1991 | Jacobs | |
| 5,109,318 A | 4/1992 | Funari et al. | |

(Continued)

FOREIGN PATENT DOCUMENTS

| | | |
|---|---|---|
| JP | 05-335695 | 12/1993 |
| JP | 2821315 | 11/1998 |

(Continued)

OTHER PUBLICATIONS

Shawn Hall et al., "Low Cost, High Performance Heatsinks for Closely Spaced Dimms," presentation to JEDEC, Dec. 5, 2006.

*Primary Examiner* — Anatoly Vortman

(74) *Attorney, Agent, or Firm* — Jamie J. Zheng, Esq.

(57) ABSTRACT

A heat dissipation system for use with an electronic module is provided. The electronic module includes a first side with a first plurality of electronic components mounted thereon and a second side with a second plurality of electronic components mounted thereon. The heat dissipation system includes a first segment mountable on the module to be in thermal communication with at least one electronic component of the first plurality of electronic components. The system further includes a second segment mountable on the module to be in thermal communication with at least one electronic component of the second plurality of electronic components. The system includes a third segment mountable on the module to be in thermal communication with the first segment and with the second segment, the third segment providing a path through which heat flows from the first segment to the second segment.

16 Claims, 32 Drawing Sheets

(56) References Cited

U.S. PATENT DOCUMENTS

| | | |
|---|---|---|
| 5,229,916 A | 7/1993 | Frankeny et al. |
| 5,244,023 A | 9/1993 | Spies |
| 5,313,097 A | 5/1994 | Haj-Ali-Ahmadi et al. |
| 5,343,359 A | 8/1994 | Morton et al. |
| 5,432,913 A | 7/1995 | Smits et al. |
| 5,445,869 A | 8/1995 | Ishikawa et al. |
| 5,513,135 A | 4/1996 | Dell et al. |
| 5,661,339 A * | 8/1997 | Clayton ............ 257/678 |
| 5,710,693 A | 1/1998 | Tsukada et al. |
| 5,731,633 A | 3/1998 | Clayton |
| 5,739,687 A | 4/1998 | Hanley |
| 5,751,553 A | 5/1998 | Clayton |
| 5,754,409 A | 5/1998 | Smith |
| 5,784,263 A | 7/1998 | Nelson |
| 5,812,374 A | 9/1998 | Shuff |
| 5,892,658 A | 4/1999 | Urda et al. |
| 5,892,660 A * | 4/1999 | Farnworth et al. ............ 361/728 |
| 5,896,274 A | 4/1999 | Ishida |
| 5,901,781 A | 5/1999 | Arai et al. |
| 5,949,650 A | 9/1999 | Bulante et al. |
| 5,949,657 A | 9/1999 | Karabatsos |
| 5,966,287 A | 10/1999 | Lofland et al. |
| 5,986,887 A | 11/1999 | Smith et al. |
| 6,021,048 A | 2/2000 | Smith |
| 6,025,992 A | 2/2000 | Dodge et al. |
| 6,031,727 A * | 2/2000 | Duesman et al. ............ 361/761 |
| 6,049,975 A | 4/2000 | Clayton |
| 6,064,575 A | 5/2000 | Urda et al. |
| 6,091,145 A | 7/2000 | Clayton |
| 6,104,613 A | 8/2000 | Urda et al. |
| 6,119,765 A | 9/2000 | Lee |
| 6,151,215 A | 11/2000 | Hoffman |
| 6,157,541 A | 12/2000 | Hacke |
| 6,173,382 B1 | 1/2001 | Dell et al. |
| 6,180,881 B1 | 1/2001 | Isaak |
| 6,201,700 B1 | 3/2001 | Tzimares et al. |
| 6,208,517 B1 | 3/2001 | Prince et al. |
| 6,222,739 B1 | 4/2001 | Bhakta et al. |
| 6,232,659 B1 | 5/2001 | Clayton |
| 6,233,150 B1 | 5/2001 | Lin et al. |
| 6,297,960 B1 | 10/2001 | Moden et al. |
| 6,377,460 B1 | 4/2002 | Pohl et al. |
| 6,381,140 B1 | 4/2002 | Liao |
| 6,392,305 B1 | 5/2002 | Huang et al. |
| 6,423,909 B1 | 7/2002 | Haynie et al. |
| 6,424,532 B2 | 7/2002 | Kawamura |
| 6,444,921 B1 | 9/2002 | Wang et al. |
| 6,449,159 B1 | 9/2002 | Haba |
| 6,507,912 B1 | 1/2003 | Matyas, Jr. et al. |
| 6,510,100 B2 | 1/2003 | Grundon et al. |
| 6,525,943 B2 | 2/2003 | Moden et al. |
| 6,535,387 B2 | 3/2003 | Summers et al. |
| 6,576,992 B1 | 6/2003 | Cady et al. |
| 6,590,282 B1 | 7/2003 | Wang et al. |
| 6,713,854 B1 | 3/2004 | Kledzik et al. |
| 6,740,821 B1 | 5/2004 | Jiang et al. |
| 6,757,751 B1 | 6/2004 | Gene |
| 6,760,224 B2 | 7/2004 | Moden et al. |
| 6,762,942 B1 | 7/2004 | Smith |
| 6,765,797 B2 | 7/2004 | Summers et al. |
| 6,833,984 B1 | 12/2004 | Belgacem |
| 6,888,719 B1 * | 5/2005 | Janzen et al. ............ 361/679.31 |
| 6,956,284 B2 | 10/2005 | Cady et al. |
| 7,023,700 B2 | 4/2006 | Chiou et al. |
| 7,023,701 B2 | 4/2006 | Stocken et al. |
| 7,053,478 B2 | 5/2006 | Roper et al. |
| 7,079,396 B2 | 7/2006 | Gates et al. |
| 7,094,632 B2 | 8/2006 | Cady et al. |
| 7,106,595 B2 | 9/2006 | Foster et al. |
| 7,181,167 B2 | 2/2007 | Onggosanusi et al. |
| 7,215,551 B2 | 5/2007 | Wang et al. |
| 7,254,036 B2 | 8/2007 | Pauley et al. |
| 7,289,327 B2 | 10/2007 | Goodwin et al. |
| 7,304,842 B2 | 12/2007 | Yatskov |
| 7,345,882 B2 | 3/2008 | Lee et al. |
| 7,349,219 B2 | 3/2008 | Lai et al. |
| 7,349,220 B2 | 3/2008 | Lai et al. |
| 7,375,970 B2 | 5/2008 | Pauley et al. |
| 7,382,617 B2 | 6/2008 | Yu et al. |
| 7,400,506 B2 | 7/2008 | Hoss et al. |
| 7,442,050 B1 | 10/2008 | Bhakta et al. |
| 7,443,023 B2 | 10/2008 | Wehrly et al. |
| 7,457,122 B2 | 11/2008 | Lai et al. |
| 7,474,529 B2 | 1/2009 | Tian et al. |
| 7,477,520 B2 | 1/2009 | Shibamoto et al. |
| 7,609,523 B1 | 10/2009 | Ni et al. |
| 7,619,893 B1 | 11/2009 | Yu |
| 7,630,202 B2 | 12/2009 | Pauley et al. |
| 7,684,197 B2 * | 3/2010 | Zhu et al. ............ 361/719 |
| 7,688,592 B2 * | 3/2010 | Gruendler et al. ............ 361/719 |
| 7,715,197 B2 * | 5/2010 | Tian et al. ............ 361/719 |
| 7,755,897 B2 | 7/2010 | Chen et al. |
| 7,760,509 B1 * | 7/2010 | Zhao et al. ............ 361/719 |
| 7,768,785 B2 | 8/2010 | Ni et al. |
| 7,811,097 B1 | 10/2010 | Bhakta et al. |
| 7,990,699 B2 * | 8/2011 | Lian et al. ............ 361/679.47 |
| 8,154,873 B2 * | 4/2012 | Lian et al. ............ 361/715 |
| 2002/0001180 A1 * | 1/2002 | Kawamura ............ 361/715 |
| 2002/0039282 A1 | 4/2002 | Han et al. |
| 2002/0076959 A1 | 6/2002 | Lee |
| 2002/0125039 A1 | 9/2002 | Marketkar et al. |
| 2003/0026076 A1 | 2/2003 | Wei |
| 2003/0116835 A1 | 6/2003 | Miyamoto et al. |
| 2003/0234443 A1 | 12/2003 | Partridge et al. |
| 2004/0130873 A1 | 7/2004 | Hsueh |
| 2004/0156174 A1 * | 8/2004 | Rubenstein et al. ............ 361/705 |
| 2004/0218367 A1 | 11/2004 | Lin et al. |
| 2004/0229402 A1 | 11/2004 | Cady et al. |
| 2004/0236877 A1 | 11/2004 | Burton |
| 2004/0250989 A1 | 12/2004 | Im et al. |
| 2004/0262737 A1 | 12/2004 | Haba |
| 2005/0018412 A1 | 1/2005 | Roper et al. |
| 2005/0047776 A1 | 3/2005 | Watanabe et al. |
| 2005/0057911 A1 | 3/2005 | Rapport et al. |
| 2005/0078457 A1 | 4/2005 | Hsieh et al. |
| 2005/0141199 A1 | 6/2005 | Chiou et al. |
| 2005/0146031 A1 | 7/2005 | Partridge et al. |
| 2005/0242423 A1 | 11/2005 | Partridge et al. |
| 2005/0259504 A1 | 11/2005 | Murtugh et al. |
| 2005/0263911 A1 | 12/2005 | Igarashi et al. |
| 2005/0276021 A1 | 12/2005 | Gates et al. |
| 2005/0289287 A1 | 12/2005 | Shin et al. |
| 2006/0020740 A1 | 1/2006 | Bartley et al. |
| 2006/0048385 A1 | 3/2006 | Cady et al. |
| 2006/0049500 A1 | 3/2006 | Goodwin |
| 2006/0049502 A1 | 3/2006 | Goodwin et al. |
| 2006/0049512 A1 | 3/2006 | Goodwin |
| 2006/0049513 A1 | 3/2006 | Goodwin |
| 2006/0050488 A1 | 3/2006 | Goodwin |
| 2006/0050489 A1 | 3/2006 | Wehrly, Jr. et al. |
| 2006/0050492 A1 | 3/2006 | Goodwin et al. |
| 2006/0050496 A1 | 3/2006 | Goodwin |
| 2006/0050497 A1 | 3/2006 | Goodwin |
| 2006/0050498 A1 | 3/2006 | Cady et al. |
| 2006/0050592 A1 | 3/2006 | Cady et al. |
| 2006/0053345 A1 | 3/2006 | Goodwin |
| 2006/0056154 A1 | 3/2006 | Foster et al. |
| 2006/0083043 A1 | 4/2006 | Cypher |
| 2006/0090102 A1 | 4/2006 | Wehrly, Jr. et al. |
| 2006/0090119 A1 | 4/2006 | Dong et al. |
| 2006/0091529 A1 | 5/2006 | Wehrly, Jr. et al. |
| 2006/0095592 A1 | 5/2006 | Borkenhagen |
| 2006/0111866 A1 | 5/2006 | LeClerg et al. |
| 2006/0125067 A1 | 6/2006 | Wehrly, Jr. et al. |
| 2006/0129888 A1 | 6/2006 | Szewerenko et al. |
| 2006/0198238 A1 | 9/2006 | Partridge et al. |
| 2006/0203442 A1 | 9/2006 | Goodwin |
| 2006/0203454 A1 | 9/2006 | Chang |
| 2006/0250780 A1 | 11/2006 | Goodwin |
| 2006/0261449 A1 | 11/2006 | Rapport et al. |
| 2006/0268523 A1 | 11/2006 | Lin |
| 2007/0111606 A1 | 5/2007 | Goodwin |
| 2007/0115017 A1 | 5/2007 | Goodwin et al. |
| 2007/0126124 A1 | 6/2007 | Rapport et al. |

(56) References Cited

U.S. PATENT DOCUMENTS

| | | |
|---|---|---|
| 2007/0126125 A1 | 6/2007 | Rapport et al. |
| 2007/0139897 A1 | 6/2007 | RaghuRam |
| 2007/0195489 A1 | 8/2007 | Lai et al. |
| 2007/0201208 A1 | 8/2007 | Goodwin et al. |
| 2007/0223198 A1 | 9/2007 | Lai et al. |
| 2007/0263360 A1 | 11/2007 | Lai et al. |
| 2007/0274032 A1 | 11/2007 | Ni et al. |
| 2008/0013282 A1 | 1/2008 | Hoss et al. |
| 2008/0101036 A1 | 5/2008 | Chen |
| 2008/0116571 A1 | 5/2008 | Dang et al. |
| 2008/0123300 A1 | 5/2008 | Tian et al. |
| 2009/0129026 A1 | 5/2009 | Baek et al. |
| 2010/0110642 A1 | 5/2010 | Pauley et al. |

FOREIGN PATENT DOCUMENTS

| | | |
|---|---|---|
| JP | 2001077294 | 3/2001 |
| JP | 2003086760 | 3/2003 |
| JP | 2003086761 | 3/2003 |

* cited by examiner

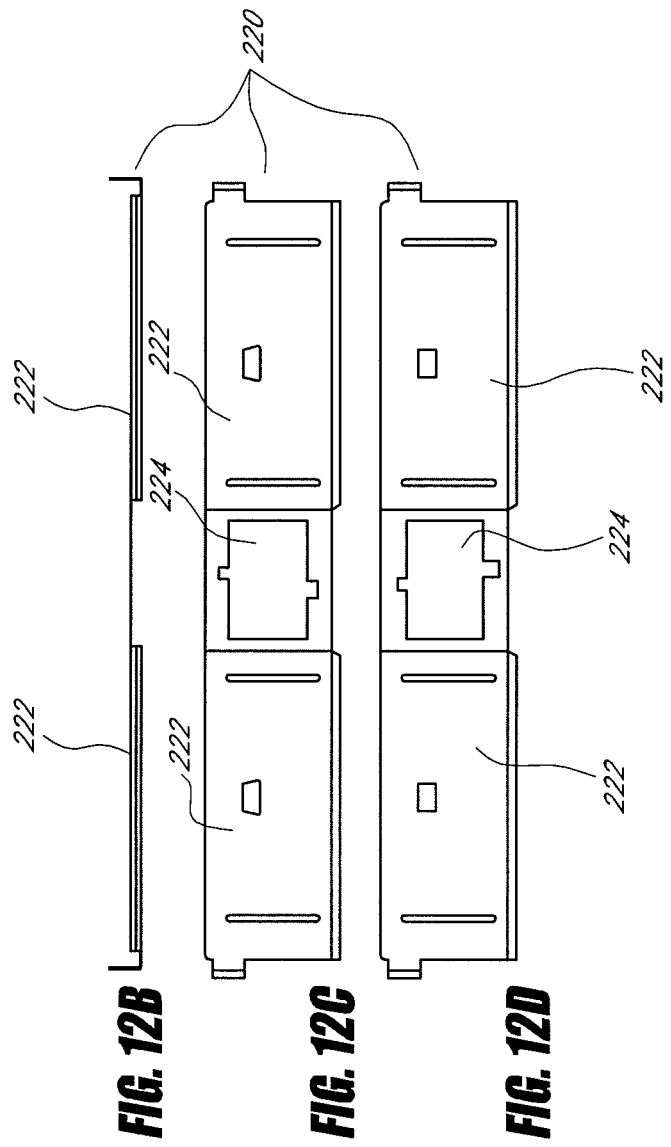
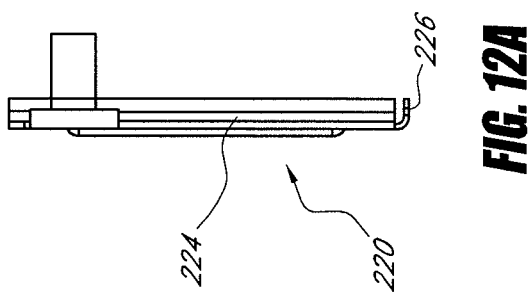

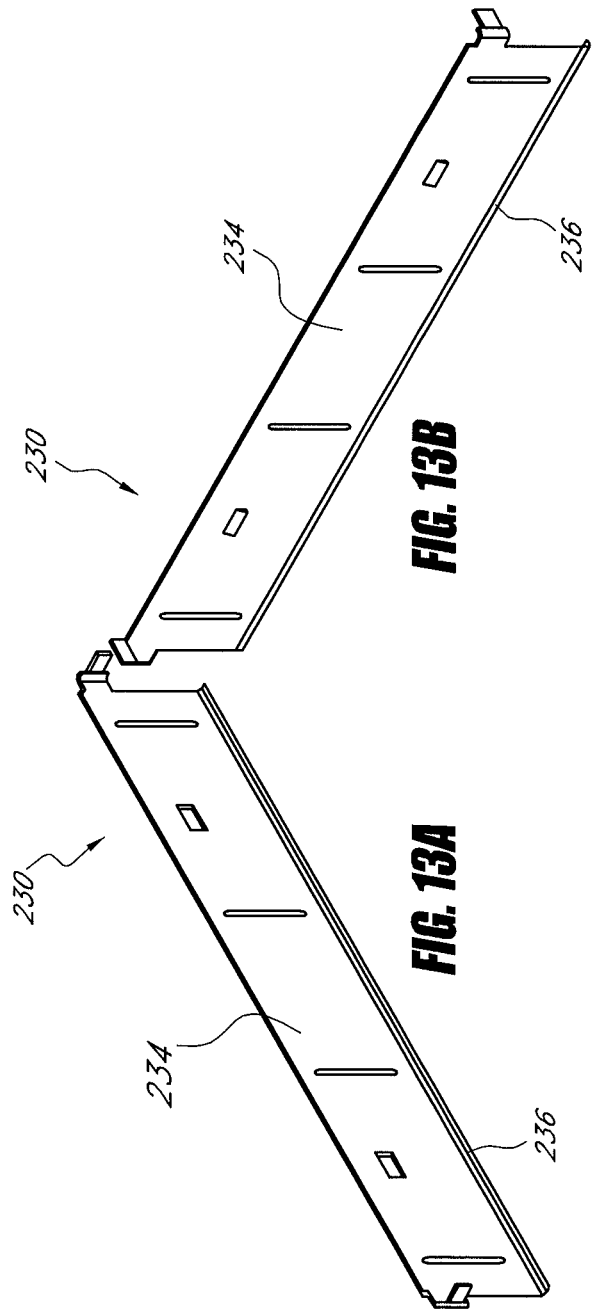

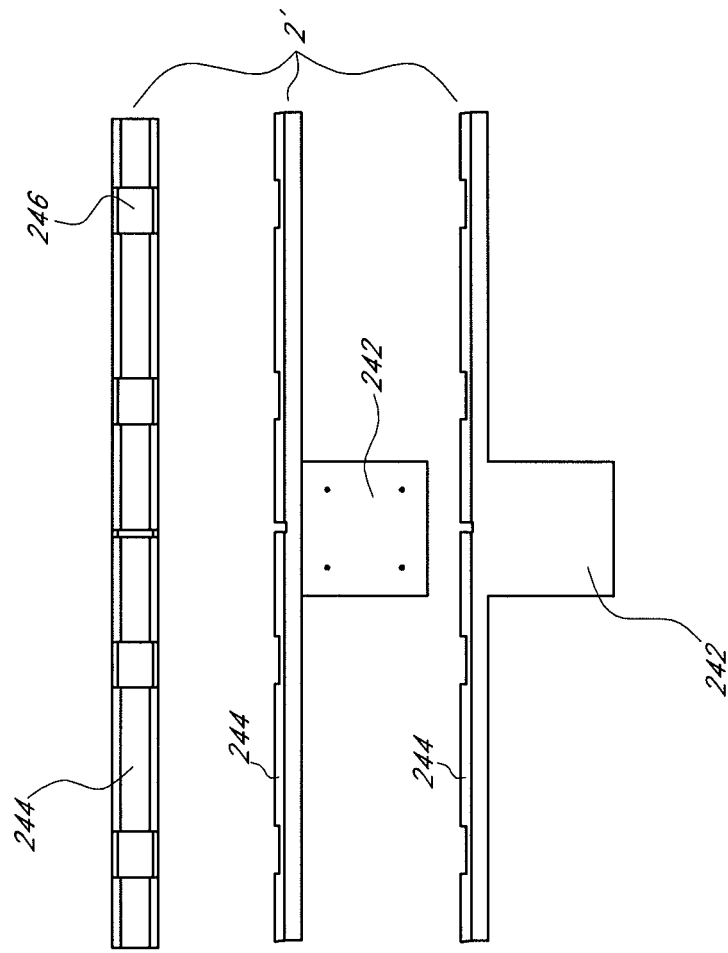
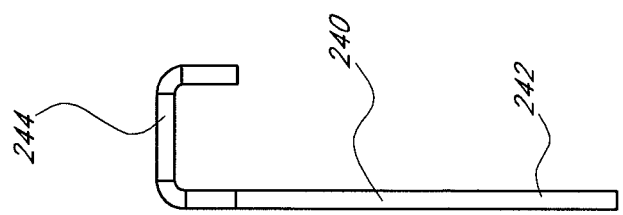
FIG. 14A

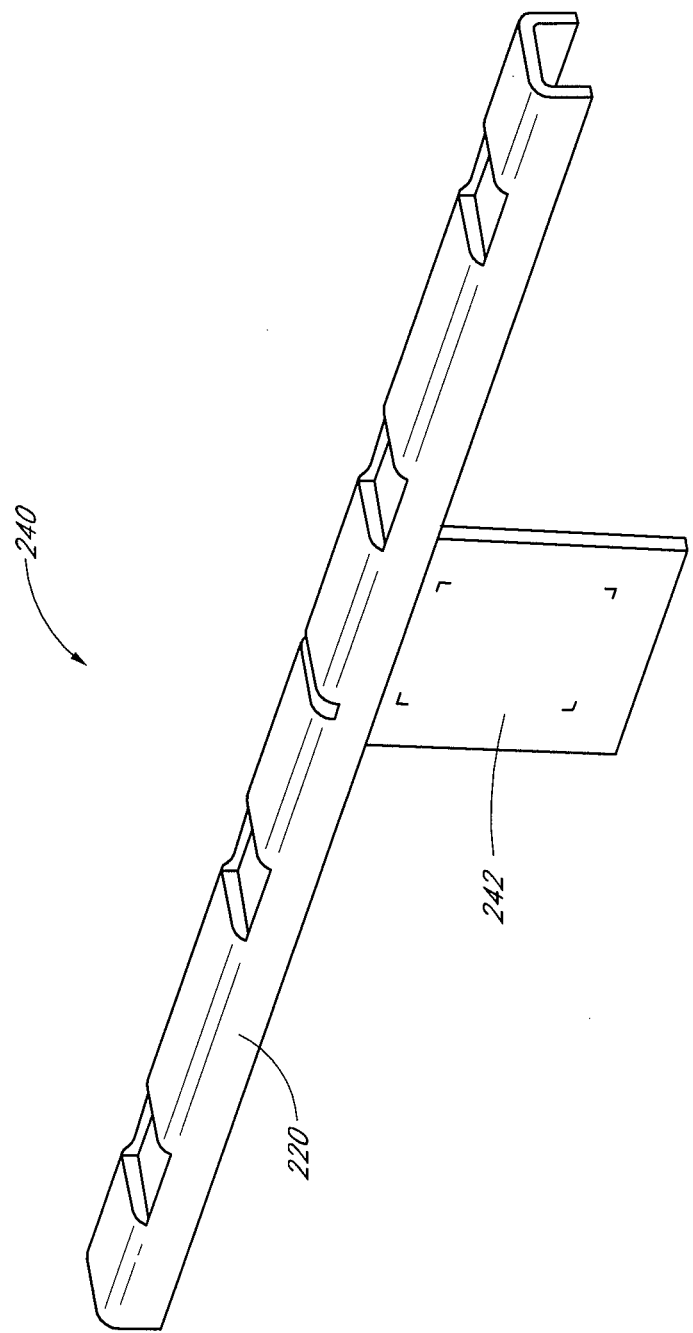

200

HEAT DISSIPATION FOR ELECTRONIC MODULES

CROSS-REFERENCE TO RELATED APPLICATIONS

The present application is a continuation of U.S. patent application Ser. No. 12/432,591, filed Apr. 29, 2009, which claims the benefit of priority from U.S. Provisional Application No. 61/049,153, filed Apr. 30, 2008, which is incorporated in its entirety by reference herein.

BACKGROUND

1. Field

The present application relates generally to the field of heat dissipation systems for electronic modules.

2. Description of the Related Art

High density electronic modules (e.g., memory modules) dissipate a significant amount of heat which may degrade performance of the modules in end-use applications. Typically, heat dissipation systems made of conductive metal, such as copper or aluminum, are used to distribute the dissipated heat across the surface of the module, which is cooled by the system ventilation. Example heat dissipation systems may be found in U.S. patent application Ser. No. 11/707,625, filed Feb. 16, 2007, and entitled "Heat Spreader for Electronic Modules," which is incorporated in its entirety by reference herein.

SUMMARY

In certain embodiments, a heat dissipation system for use with an electronic module is provided. The electronic module includes a first side with a first plurality of electronic components mounted thereon and a second side with a second plurality of electronic components mounted thereon. The heat dissipation system comprises a first segment mountable on the module to be in thermal communication with at least one electronic component of the first plurality of electronic components. The system further comprises a second segment mountable on the module to be in thermal communication with at least one electronic component of the second plurality of electronic components. The system further comprises a third segment mountable on the module to be in thermal communication with the first segment and with the second segment, the third segment providing a path through which heat flows from the first segment to the second segment.

In certain embodiments, a method of thermally coupling a heat dissipation system to an electronic module is provided. The module includes a first side with a first plurality of electronic components mounted thereon and a second side with a second plurality of electronic components mounted thereon. The method comprises mounting a first segment on the module to be in thermal communication with at least one electronic component of the first plurality of electronic components. The method further comprises mounting a second segment on the module to be in thermal communication with at least one electronic component of the second plurality of electronic components. The method further comprises mounting a third segment on the module to be in thermal communication with the first segment and with the second segment, the third segment providing a path through which heat flows from the first segment to the second segment.

A heat spreader is provided in certain embodiments which is mountable on an electronic module having a side with a plurality of electronic components mounted thereon. The heat spreader comprises a first heat dissipation portion in thermal communication with at least one of the plurality of electronic components. The heat spreader further comprises a second heat dissipation portion extending along the side of the module, the second heat dissipation portion in thermal communication with the first heat dissipation portion. At least one of the plurality of electronic components on the electronic module is between the second heat dissipation portion and the side and is spaced away from the second heat dissipation portion.

BRIEF DESCRIPTION OF THE DRAWINGS

FIGS. 12A-12D schematically illustrate various views of another example first segment of the heat dissipation system of FIG. 11 compatible with certain embodiments described herein.

FIGS. 13A-13B schematically illustrate various views of another example second segment of the heat dissipation system of FIG. 11 compatible with certain embodiments described herein.

FIGS. 14A-14E schematically illustrate various views of another example third segment of the heat dissipation system of FIG. 11 compatible with certain embodiments described herein.

DETAILED DESCRIPTION

Figure 1A:
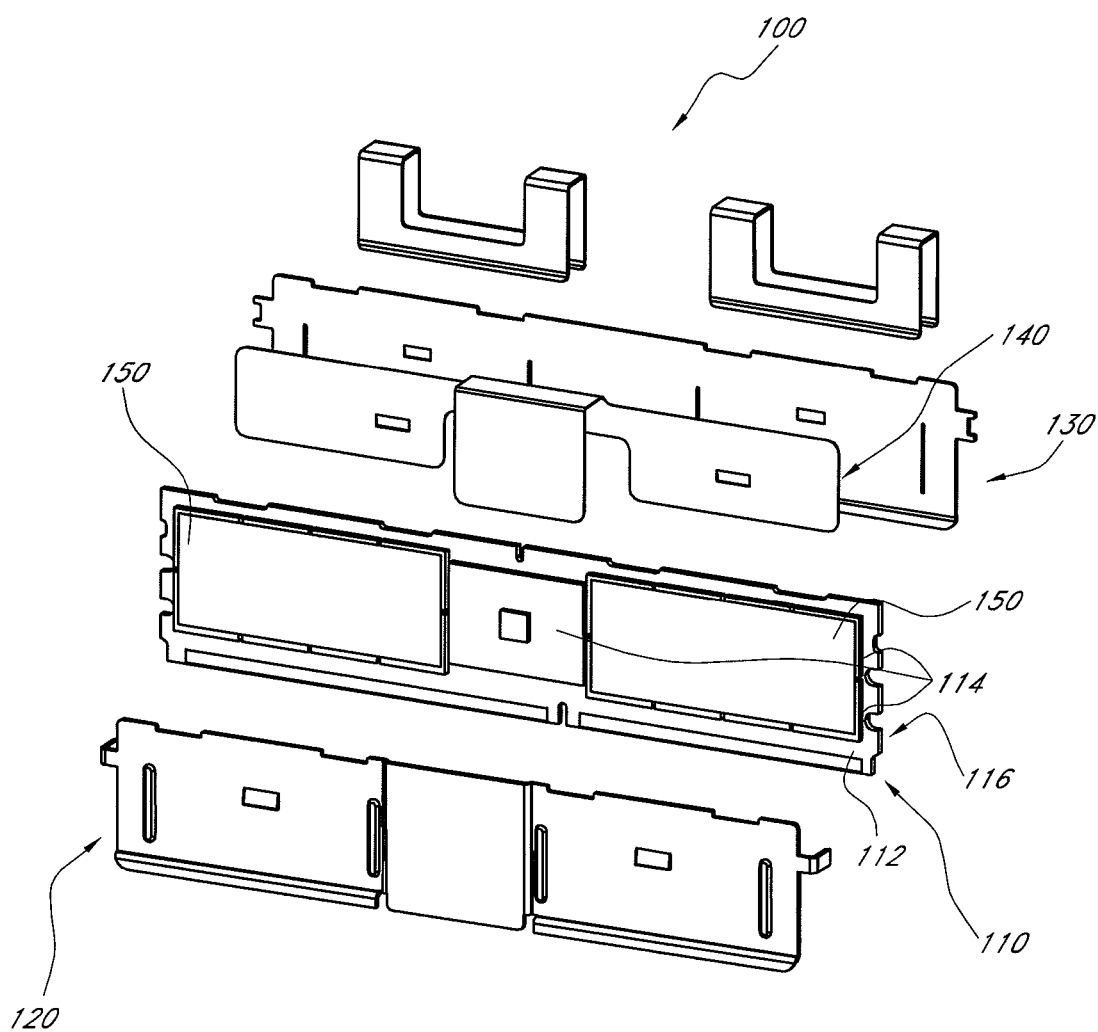
FIGS. 1A-1C schematically illustrate exploded views from various angles of a heat dissipation system compatible with certain embodiments described herein.

Heat dissipation systems for electronic modules typically include one or more heat spreaders which generally distribute heat evenly across the surface area of the electronic module (e.g., memory module), and they also tend to heat cooler components on the module, thereby causing these components to operate at slower speeds. For example, for fully-buffered dual-inline memory module (FBDIMM) designs which use an advanced memory buffer (AMB), heat dissipated by the AMB can increase its temperature by 125° C. or more. This increased temperature not only degrades the performance of the AMB, but also affects its long-term reliability. Many existing heat dissipation systems typically either cover the entire module on both sides, or are localized to draw heat from the AMB, which is typically the hottest component on the module.

In certain embodiments described herein, a heat dissipation system is provided which draws heat efficiently from the hotter components on the module and spreads the heat generally evenly over the electronic module, thereby significantly improving the thermal profile of the module. For example, in certain embodiments described herein, a heat dissipation system is provided which provides for efficient heat transfer from one side of the module to the other side of the module. For example, in certain embodiments, the heat dissipation system can achieve temperature differences across the components of the memory module (e.g., between memory devices and other memory devices and/or between memory devices and other components, such as an AMB) which are less than about 50 degrees Celsius. In other embodiments, the heat dissipation system can achieve lower temperature differences across the components of the memory module, such as temperature differences which are less than about 40 degrees Celsius, or lower. A similar memory module not having a heat dissipation system in accordance with embodiments described herein (e.g., having some other heat dissipation system, or having no heat dissipation system), on the other hand, may have temperature differences of up to about 60 degrees Celsius. In certain embodiments, the heat dissipation system can achieve differences between DRAM devices of the memory module of less than about 10 degrees Celsius. In other embodiments, the heat dissipation system can achieve lower temperature differences across the memory devices of the memory module, such as temperature differences which are less than about 5 degrees Celsius, or lower. In contrast, a similar memory module not having a heat dissipation system in accordance with embodiments described herein may have temperature differences between DRAM devices of up to 20 degrees Celsius. For example, the temperature differences between DRAM devices of such a memory module may range from about 5 degrees Celsius to about 20 degrees Celsius.

Certain embodiments described herein advantageously provide heat transfer from the module while keeping the overall thickness of the combined heat dissipation system and module sufficiently small to fit within the space available in conventional computer systems. In certain embodiments, the thickness of the combined heat dissipation system and module are from between about 3.4 millimeters and about 7.55 millimeters. In other embodiments, the thickness may be less than 3.4 millimeters or greater than 7.55 millimeters. Furthermore, certain embodiments described herein advantageously avoid heat from hotter components on the module from unduly heating cooler components on the module. For example, for certain DRAM devices, DRAM case (e.g., package) temperatures greater than about 85 degrees Celsius, greater than 95 degrees Celsius, or greater than 40 degrees Celsius above the ambient temperature may cause undue heating and possible malfunction of the DRAM device. Thus, in certain embodiments, the temperature of the DRAM device is less than 85 degrees Celsius, less than 95 degrees Celsius, or less than 40 degrees greater than the ambient temperature.

Figure 1B:
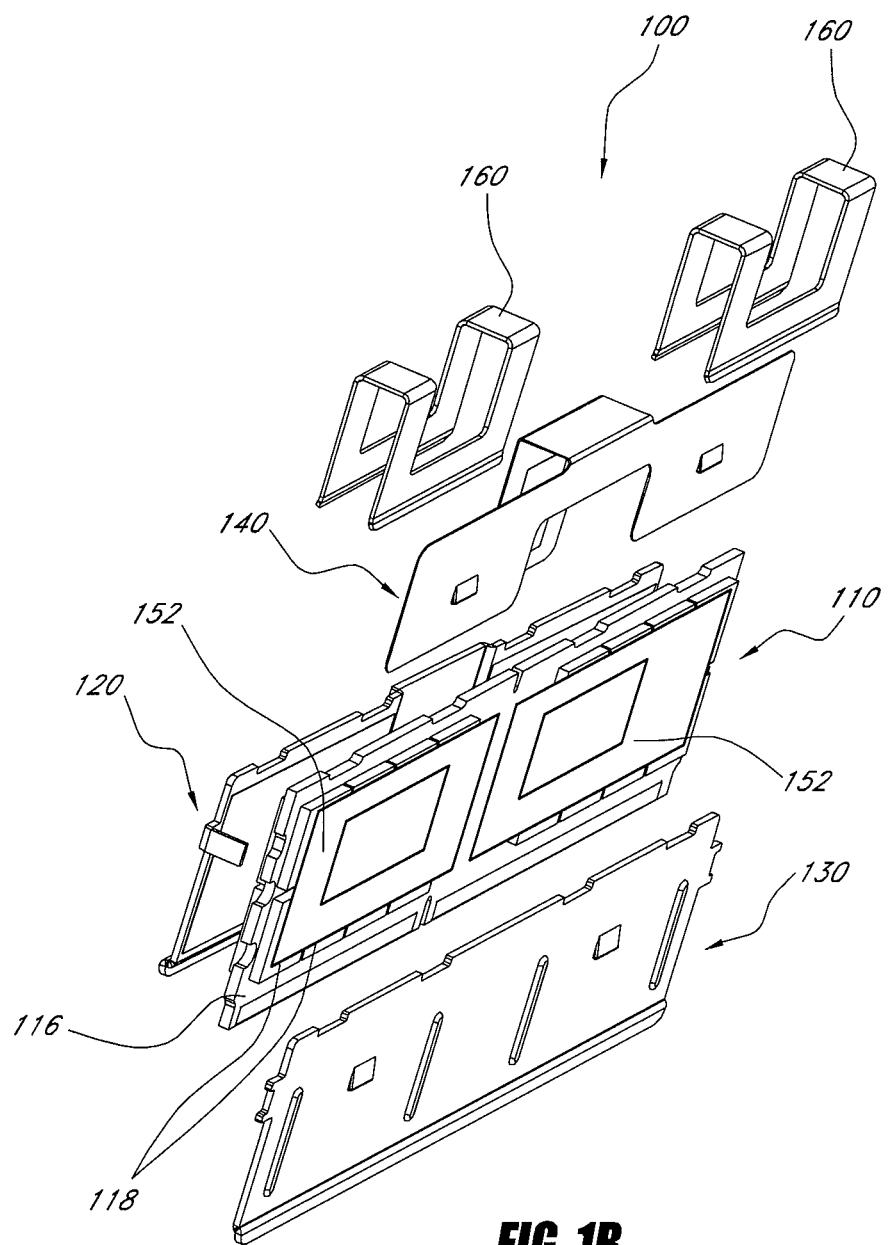
Figure 1C:
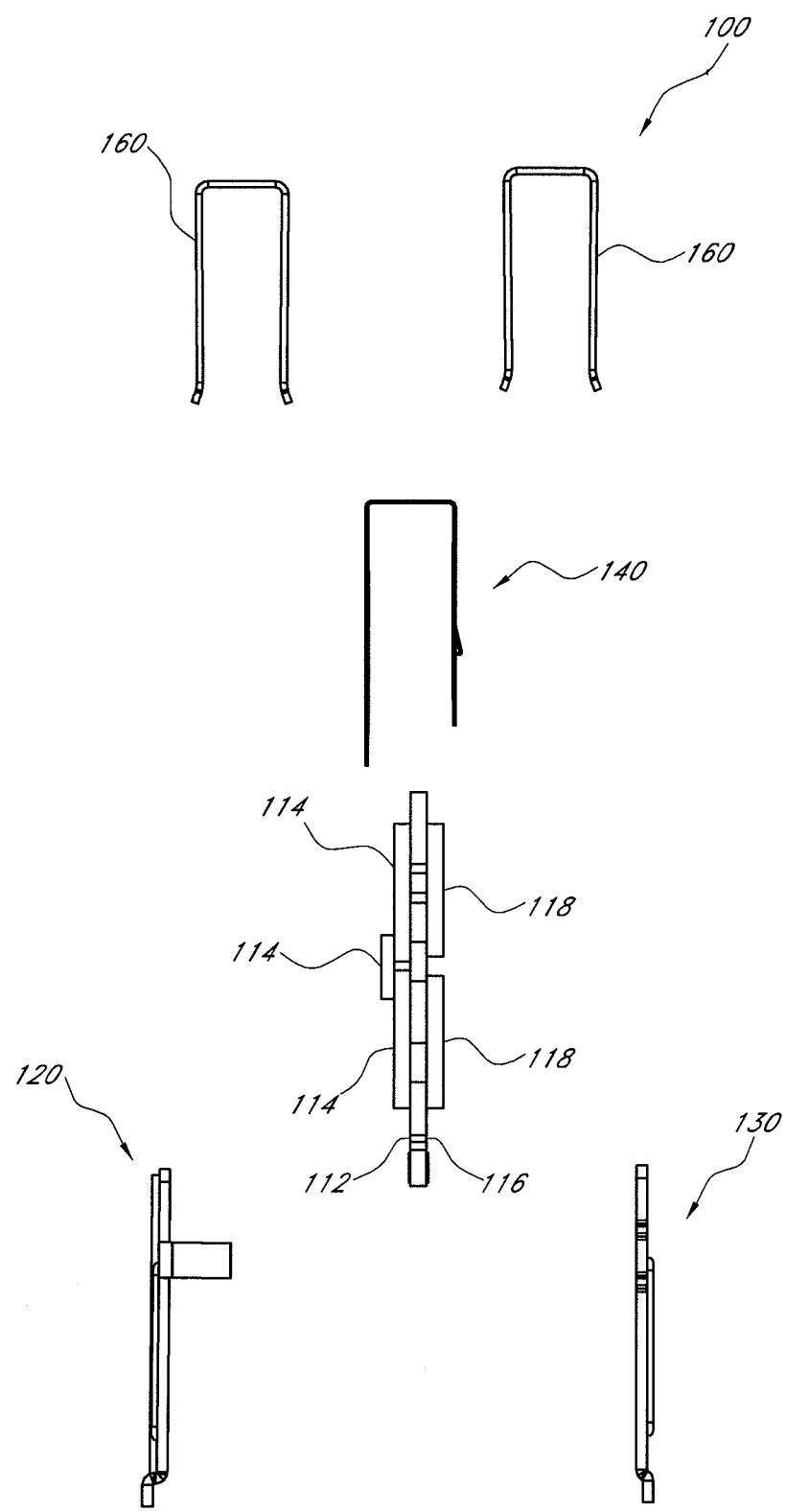

FIGS. 1A-1C schematically illustrate exploded views from various angles of a heat dissipation system 100 compatible with certain embodiments described herein. The heat dissipation system 100 is designed for use with an electronic module 110 having a first side 112 with a first plurality of electronic components 114 mounted thereon and a second side 116 with a second plurality of electronic components 118 mounted thereon. The heat dissipation system 100 comprises a first segment 120 mountable on the module 110 to be in thermal communication with at least one electronic component of the first plurality of electronic components 114. The heat dissipation system 100 further comprises a second segment 130 mountable on the module 110 to be in thermal communication with at least one electronic component of the second plurality of electronic components 118. The heat dissipation system 100 also comprises a third segment 140 mountable on the module 110 to be in thermal communication with the first segment 120 and with the second segment 130. In certain embodiments, the third segment 140 provides a path through which heat flows from the first segment 120 to the second segment 130.

In certain embodiments, the first segment 120, the second segment 130, and/or the third segment 140 are reversibly or removably mounted on the module 110 such that the first segment 120, the second segment 130, and/or the third segment 140 are removable from the module 110 without appreciably damaging the module 110. In certain embodiments the first segment, second segment and/or third segment can be repeatably mounted onto and dismounted from the module without appreciably damaging the module. As used herein the term "without appreciably damaging" has its broadest reasonable interpretation including but not limited to, resulting in no damage which affects the operability of the module or its components beyond the mere absence of the removed or dismounted segment.

Figure 2A:
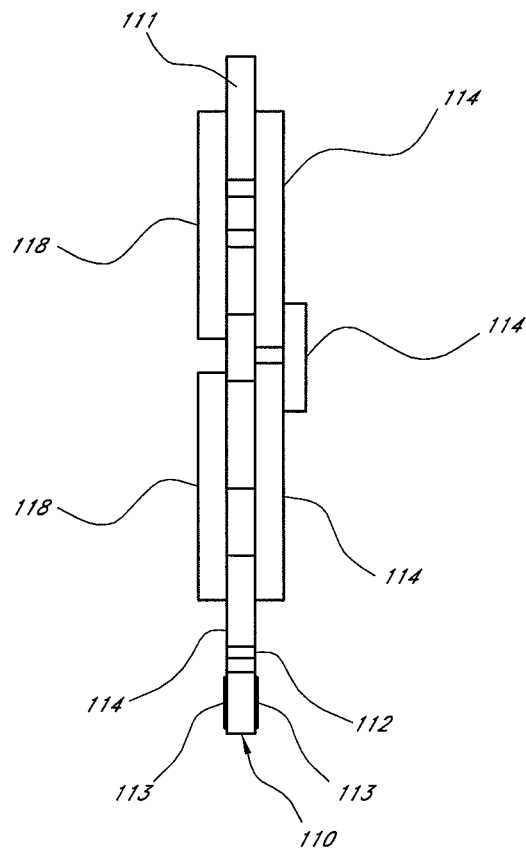
FIGS. 2A-2C schematically illustrate a FBDIMM.
Figure 2B:
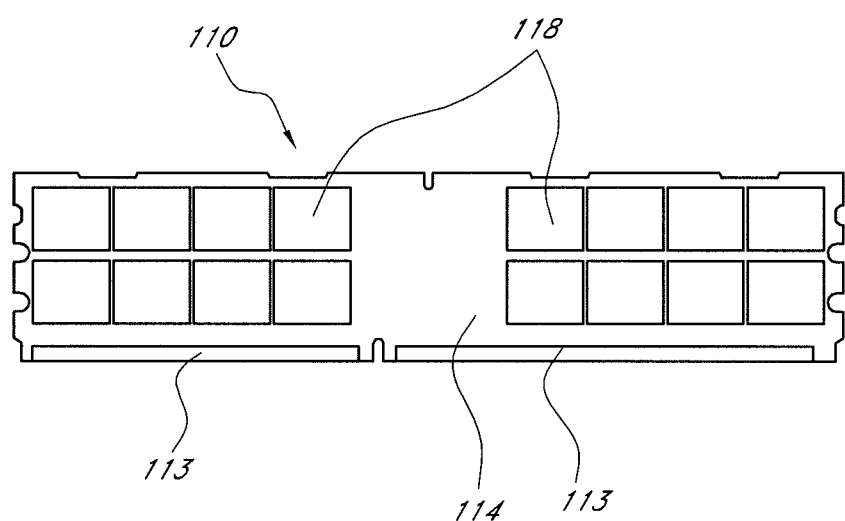
Figure 2C:
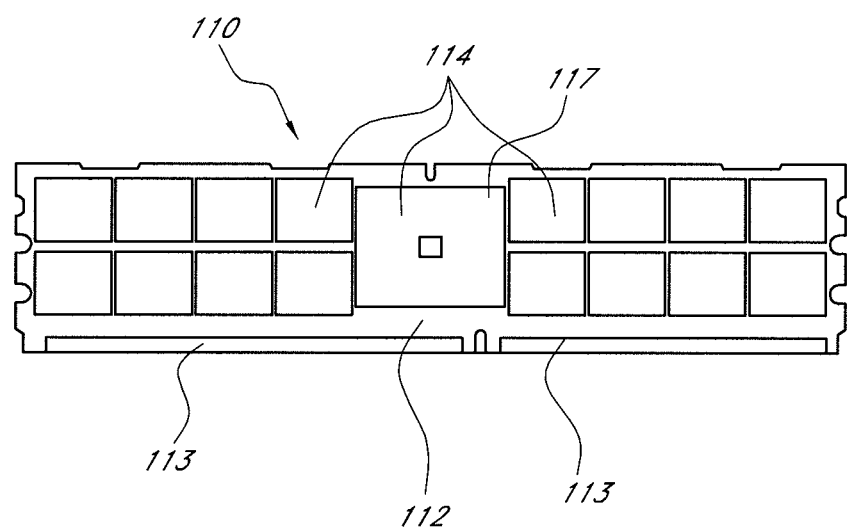

The heat dissipation system 100 schematically illustrated by FIGS. 1A-1C is designed for use with a FBDIMM, such as the example FBDIMM schematically illustrated by FIGS. 2A-2C. The FBDIMM comprises a printed-circuit board ("PCB") 111 having a first side 112 and a second side 116, with electronic components 114, 118 mounted thereon. The electronic components 114 mounted on the first side 112 comprise a plurality of memory (e.g., dynamic random-access memory or DRAM) devices and an advanced memory buffer ("AMB"). In certain embodiments, the memory devices on the first side 112 are substantially the same as one another. The electronic components 118 mounted on the second side 116 comprise a plurality of memory devices. In certain embodiments, the memory devices on the second side 116 are substantially the same as one another and as the memory devices on the first side 112. The FBDIMM also comprises a plurality of edge connectors 113 along at least one edge of the printed-circuit board 111. The edge connectors 113 are configured to be electrically coupled to a corresponding plurality of electrical contacts of a module slot of the computer system with which the module 110 is to be used. The edge connectors 113 are electrically coupled to the electronic components 114, 118 of the module 110 by electrical conduits (not shown) of the printed-circuit board 111. Examples of computer systems with which heat dissipation systems compatible with certain embodiments described herein may be used include, but are not limited to, desktop computers, workstations, servers, telecom systems, and media centers.

Other heat dissipation systems compatible with certain embodiments described herein are designed for use with other types of memory modules, including but not limited to dual in-line memory modules (DIMMs), small-outline DIMMs (SO-DIMMs), unbuffered DIMMs (UDIMMs), registered DIMMs (RDIMMs), rank-buffered DIMMs (RB-DIMMs), mini-DIMMs, and micro-DIMMs. Memory devices compatible with certain embodiments described herein include, but are not limited to, random-access memory (RAM), dynamic random-access memory (DRAM), synchronous DRAM (SDRAM), and double-data-rate DRAM (e.g., SDR, DDR-1, DDR-2, DDR-3). The memory devices may comprise other types of memory elements such as static random-access memory (SRAM). In addition, memory devices having bit widths of 4, 8, 16, 32, as well as other bit widths, are compatible with certain embodiments described herein. Memory devices compatible with certain embodiments described herein have packaging which include, but are not limited to, thin small-outline package (TSOP), ball-grid-array (BGA), fine-pitch BGA (FBGA), micro-BGA (OGA), mini-BGA (mBGA), and chip-scale packaging (CSP), and three-dimensional packaging (e.g., chip stacks, die stacks, and dual die packaging). Other heat dissipation systems compatible with certain embodiments described herein are designed for use with other types of electronic modules having at least two sides and having electronic components on each of the two sides. The pluralities of memory devices may further include one or more non-volatile memory devices, such as, for example, flash memories. The pluralities of memory devices of certain embodiments may include both volatile and non-volatile memory devices. For example, the plurality of memory devices may include one or more of DRAM, SRAM, and/or flash memory devices in some embodiments.

Figure 3A:
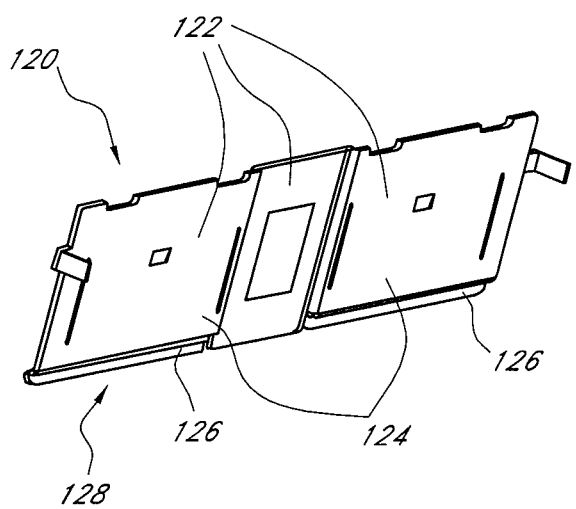
FIGS. 3A-3C schematically illustrate various views of an example first segment of the heat dissipation system compatible with certain embodiments described herein.
Figure 3B:
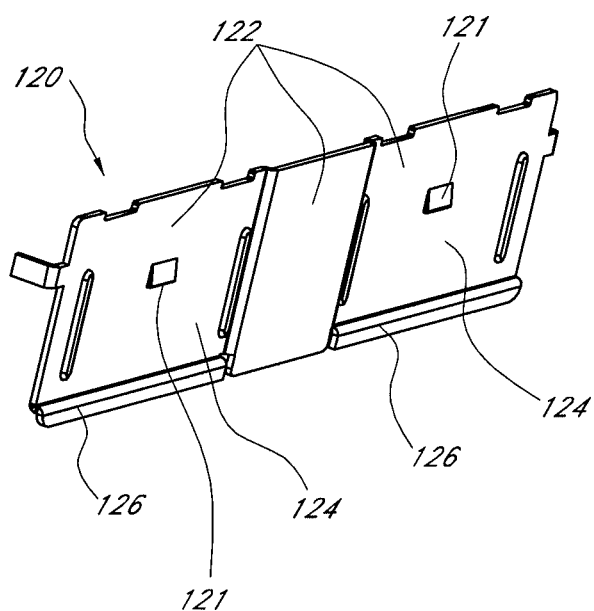
Figure 3C:
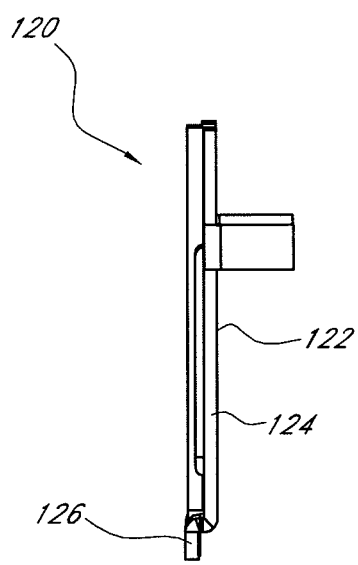

FIGS. 3A-3C schematically illustrate various views of the first segment 120 of the heat dissipation system 100 compatible with certain embodiments described herein. The first segment 120 may also be referred to as a heat spreader. The first segment 120 of certain embodiments comprises a thermally conductive material (e.g., metals, copper, aluminum, copper alloy, aluminum alloy, metal matrix composites, carbon composites). In certain embodiments, the first segment 120 comprises a single integral element or piece of material which is formed into a configuration as described herein. For example, the first segment 120 can be formed from a single sheet of metal shaped (e.g., cut, bent, or both cut and bent) into a configuration as described herein. Various ranges of thicknesses of the sheet are compatible with certain embodiments described herein, including but not limited to between 0.3 millimeter and 3 millimeters, between 0.3 millimeter and 1 millimeter, between 0.35 millimeter and 1 millimeter, and between 0.3 millimeter and 0.7 millimeter. Higher or lower thicknesses are possible in alternative configurations in accordance with certain embodiments described herein. In certain other embodiments, the first segment 120 comprises a plurality of elements which are connected together in a configuration as described herein.

In certain embodiments, the first segment 120 comprises a portion 122 that is positionable to be in thermal communication with one or more of the electronic components 114 on the first side 112 of the module 110. For example, the portion 122 comprises a substantially flat or planar portion positionable to be in thermal communication with the first plurality of electronic components 114 on the first side 112 of the module 110. In certain embodiments, the portion 122 is not flat or planar, but is contoured to fit with and to be in thermal communication with the first plurality of electronic components 114 mounted on the first side 112 of the module 110.

The heat dissipation system 100 of certain embodiments further comprises a thermally conductive material 150 (FIG. 1A) positionable between the first segment 120 and the first plurality of electronic components 114 to improve thermal conductivity between the first segment 120 and the first plurality of electronic components 114. The thermally conductive material 150 improves the thermal conductivity between the portion 122 and the electronic components 114. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material 150 in accordance with certain embodiments described herein.

In certain embodiments, the first segment 120 (or first heat spreader) comprises a first heat dissipation portion 124 in thermal communication with at least one of the plurality of electronic components 114 and a second heat dissipation portion 126 extending along the side 112 of the module 110. In certain embodiments, the first heat dissipation portion 124 and the portion 122 are the same, or overlap one another at least partially. The second heat dissipation portion 126 is in thermal communication with the first heat dissipation portion 124. At least one of the plurality of electronic components 114 on the electronic module 110 is positioned between the second heat dissipation portion 126 and the side 112 and is spaced away from the second heat dissipation portion 126. For example, in certain embodiments, one or more passive electrical components (e.g., resistors) are mounted on the side 112 and the second heat dissipation portion 126 is spaced away from the one or more passive electrical components. The second portion 126 of certain embodiments is configured so as to generally conform to the module 110 and/or one or more of the plurality of electronic components on the module 110.

The second portion 126 is configured to remove heat conducted by the first portion 124 away from the module 110. For example, the second portion 126 extends generally away from the first portion 124 and provides a thermal conduit for heat from the first side 112 of the module 110 away from the module 110. In certain embodiments, the second portion 126 removes heat conducted by the first portion 124 by increasing the heat transfer area of the first segment 120. In certain embodiments, the second portion 126 extends along an edge of the module 110 having one or more connectors 113 as described above so as to provide a low profile for the heat dissipation system 100 when the first segment 120 is mounted on the module 110.

The second portion 126 of certain embodiments is configured so as to avoid interaction with and/or to protect components (not shown) on the first side 112 of the module 110. For example, the second portion 126 may be positioned to avoid contacting passive components such as resistors and capacitors on the side 112 of the module 110. In certain embodiments, the second portion 126 may be positioned to avoid contacting active components such as transistors on the side 112 of the module 110. In certain embodiments, the second portion 126 is configured so as to avoid physical interaction with the components. In certain embodiments, the second portion 126 is configured to avoid electrical interaction with the components. In certain embodiments, the second portion 126 is configured to avoid both physical and electrical interaction with the components.

In certain embodiments one or more of the first portion 124 and/or the second portion 126 comprises a plurality of generally planar portions. In certain embodiments, the first portion 124 is contoured to fit with and to be in thermal communication with the first plurality of electronic components 114 mounted on the first side 112 of the module 110.

Figure 4A:
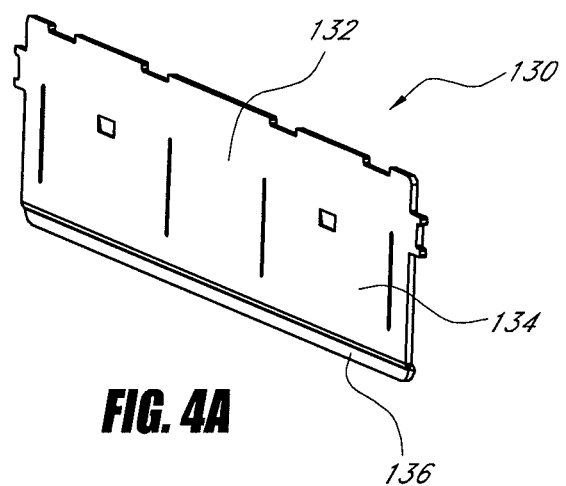
FIGS. 4A-4C schematically illustrate various views of an example second segment of the heat dissipation system compatible with certain embodiments described herein.
Figure 4B:
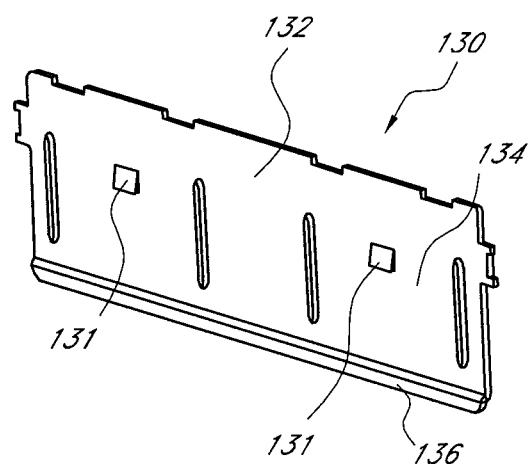
Figure 4C:
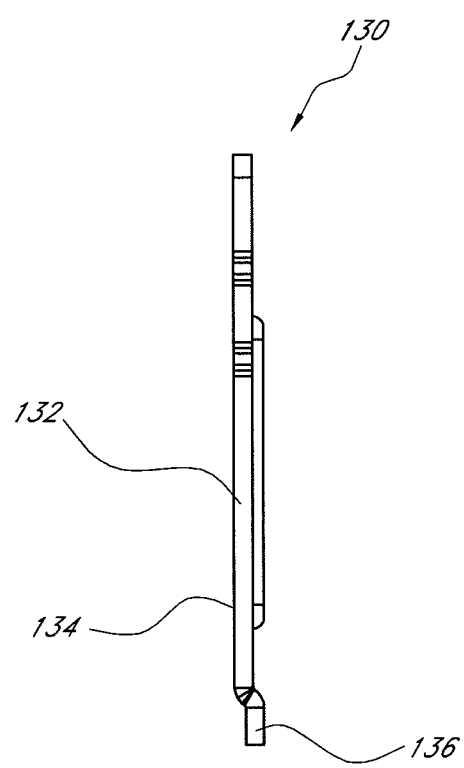

FIGS. 4A-4C schematically illustrate various views of the second segment 130 of the heat dissipation system 100 compatible with certain embodiments described herein. The second segment 130 may also be referred to as a heat spreader. The second segment 130 of certain embodiments comprises a thermally conductive material (e.g., metals, copper, aluminum, copper alloy, aluminum alloy, metal matrix composites, carbon composites). In certain embodiments, the second segment 130 comprises a single integral element or piece of material which is formed into a configuration as described herein. For example, the second segment 130 can be formed from a single sheet of metal shaped (e.g. cut, bent, or both cut and bent) into a configuration as described herein. Various ranges of thicknesses of the sheet are compatible with certain embodiments described herein, including but not limited to between 0.3 millimeter and 3 millimeters, between 0.3 millimeter and 1 millimeter, between 0.35 millimeter and 1 millimeter, and between 0.3 millimeter and 0.7 millimeter. Higher or lower thicknesses are possible in alternative configurations in accordance with certain embodiments described herein. In certain other embodiments, the second segment 130 comprises a plurality of elements which are connected together in a configuration as described herein.

In certain embodiments, the second segment 130 comprises a portion 132 that is positionable to be in thermal communication with one or more of the electronic components 118 on the second side 116 of the module 110. For example, the portion 132 comprises a substantially flat or planar portion positionable to be in thermal communication with the second plurality of electronic components 118 on the second side 116 of the module 110. In certain embodiments, the portion 132 is not flat or planar, but is contoured to fit with and to be in thermal communication with the second plurality of electronic components 118 mounted on the second side 116 of the module 110.

The heat dissipation system 100 of certain embodiments further comprises a thermally conductive material 152 (FIG. 1B) positionable between the second segment 130 and the second plurality of electronic components 118 which can be generally similar to the thermally conductive materials described herein.

In certain embodiments, the second segment 130 (or second heat spreader) comprises a first heat dissipation portion 134 in thermal communication with at least one of the plurality of electronic components 118 and a second heat dissipation portion 136 extending along the side 116 of the module 110. The second heat dissipation portion 136 is in thermal communication with the first heat dissipation portion 134. At least one of the plurality of electronic components 118 on the electronic module 110 is positioned between the second heat dissipation portion 136 and the side 116 and is spaced away from the second heat dissipation portion 136. For example, in certain embodiments, one or more passive electrical components (e.g., resistors) are mounted on the side 116 and the second heat dissipation portion 136 is spaced away from the one or more passive electrical components. The second portion 136 of certain embodiments is configured so as to generally conform to the module 110 and/or one or more of the plurality of electronic components on the module 110.

The second portion 136 is configured to remove heat conducted by the first portion 134 away from the module 110. For example, the second portion 136 extends generally away from the first portion 134 and provides a thermal conduit for heat from the second side 116 of the module 110 away from the module 110. In certain embodiments, the second portion 136 removes heat conducted by the first portion 134 by increasing the heat transfer area of the second segment 130. In certain embodiments, the second portion 136 extends along an edge of the module 110 having one or more connectors 113 as described above so as to provide a low profile for the heat dissipation system 100 when the second segment 130 is mounted on the module 110.

In certain embodiments, the second portion 136 is configured so as to avoid interaction with and/or to protect components (not shown) on the second side 116 of the module 110. For example, the second portion 136 may be positioned to avoid contacting passive components such as resistors and capacitors on the side 116 of the module 110. In certain embodiments, the second portion 136 may be positioned to avoid contacting active components such as transistors on the side 116 of the module 110. In certain embodiments, the second portion 136 is configured so as to avoid physical interaction with the components. In certain embodiments, the second portion 136 is configured to avoid electrical interaction with the components. In certain embodiments, the second portion 136 is configured to avoid both physical and electrical interaction with the components.

In certain embodiments one or more of the first portion 134 and/or the second portion 136 comprises a plurality of generally planar portions. In certain embodiments, the first portion 134 is contoured to fit with and to be in thermal communication with the second plurality of electronic components 118 mounted on the second side 116 of the module 110.

Figure 5A:
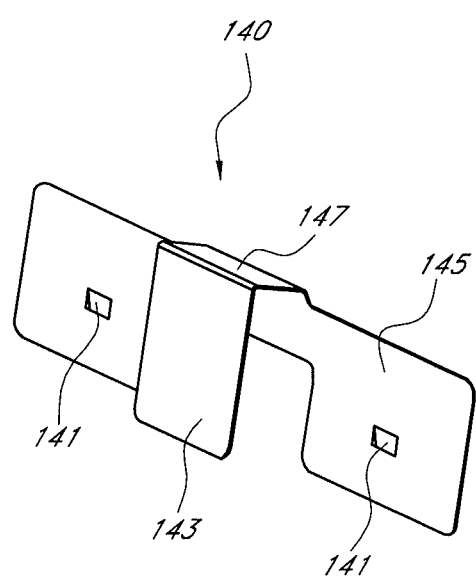
FIGS. 5A-5C schematically illustrate various views of an example third segment of the heat dissipation system compatible with certain embodiments described herein.
Figure 5B:
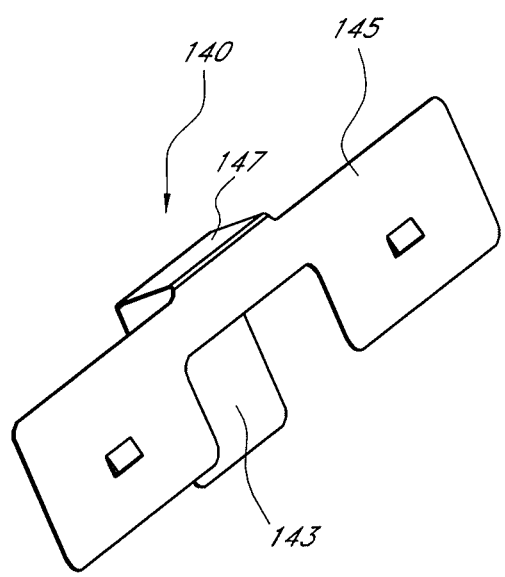
Figure 5C:
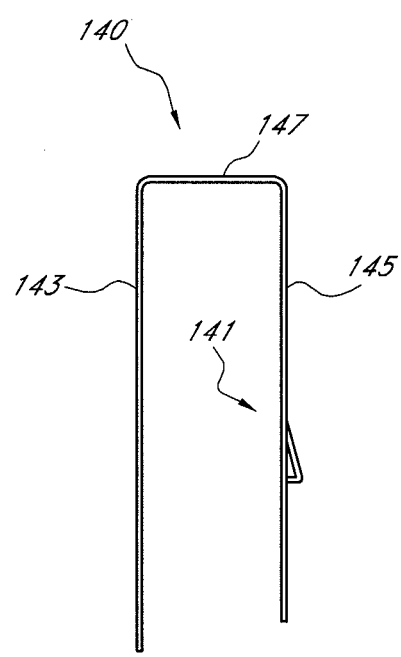

FIGS. 5A-5C schematically illustrate various views of an example third segment 140 of the heat dissipation system 100 compatible with certain embodiments described herein. In certain embodiments, the third segment 140 is mountable on the module 110 to be in thermal communication with the first segment 120 and with the second segment 130 and provides a path through which heat flows from the first segment 120 to the second segment 130. In certain embodiments, the third segment 140 comprises a thermally conductive material. In certain embodiments, for example, the third segment 140 comprises copper. In some embodiments, the third segment 140 comprises a composite material. In various embodiments, the third segment 140 can comprise aluminum, copper, copper alloy, aluminum alloy, metal matrix composites, carbon composites. In certain embodiments, the third segment comprises copper having a thermal conductivity of 401 W/(m·K) at 300 degrees Kelvin. In other embodiments, the third segment 140 comprises aluminum having a thermal conductivity of 237 W/(m·K) at 300 degrees Kelvin. In certain embodiments, the third segment 140 comprises a material that is more thermally conductive that the first segment 120 and/or second segment 130. In other embodiments, the third segment 140 can comprise a material that is similarly thermally conductive or less thermally conductive that the first segment 120 and/or the second segment 130.

In certain embodiments, the third segment 140 extends from the first segment 120 over or across an edge of the module 110 to the second segment 130. In certain embodiments, the third segment 140 extends over or across the top (non-connector) edge of the module 110. In some embodiments, the third segment 140 extends over or across multiple edges or different edges of the module 110, such as, for example, one or more sides of the module 110. In certain embodiments, the third segment 140 extends over or across only a portion of an edge of the module 110, such as a center portion of an edge of the module 110. In other embodiments, the third segment 140 extends over or across substantially an entire edge of the module 110.

The third segment 140 of some embodiments comprises a single integral element or piece of material which is formed into a configuration as described herein. For example, the third segment 140 can be formed from a single sheet of metal shaped (e.g., cut, bent, or both cut and bent) into a configuration as described herein. Various ranges of thicknesses of the sheet are compatible with certain embodiments described herein, including but not limited to between 0.3 millimeter and 3 millimeters, between 0.3 millimeter and 1 millimeter, between 0.35 millimeter and 1 millimeter, and between 0.3 millimeter and 0.7 millimeter. Higher or lower thicknesses are possible in other configurations in accordance with certain embodiments described herein.

In certain embodiments, the third segment 140 comprises a first portion 143 positionable to be in thermal communication with the first segment 120 and a second portion 145 positionable to be in thermal communication with the second segment 130. In some embodiments, the third segment 140 also comprises a third portion 147 which connects the first and second portions 143, 145. In certain embodiments, the first portion 143 is positionable to be in thermal communication with at least one of the first plurality of electronic components 114. The second portion 145 is positionable to be in thermal communication with at least one of the second plurality of electronic components 118 in certain embodiments.

In certain embodiments, the first portion 143 is positionable so as to be in thermal communication with one or more of the plurality of electronic components 114 of the module 110 which dissipate a relatively large amount of heat in comparison to the other electronic components on the module 110. For example, the first portion 143 may be positioned to be in thermal communication with the AMB 117 of the module 110. In certain embodiments, this configuration allows heat from the relatively hotter component(s) (e.g., the AMB 117) to be transferred to the second side 116 of the module 110 in a relatively efficient manner without, for example, substantially heating one or more of the other components on the first side 112 of the module 110.

The first portion 143 and/or the second portion 145 of certain embodiments are generally planar. The first portion 143 and/or the second portion 145 may be contoured or non-planar in other embodiments. The first portion 143 and/or the second portion 145 in some embodiments are shaped so as to define at least one channel or region between the first portion 143 and the first segment 120 and/or between the second portion 145 and the second segment 130. Such a configuration can, for example, allow air to flow through the channel or region between the first portion 143 and the first segment 120 and/or between the second portion 145 and the second segment in some embodiments so as to cool the module 110. In certain embodiments the first portion 143 and/or second portion 145 comprise substantially flat surfaces. In certain embodiments, the first portion 143 and/or second portion 145 comprise contoured surfaces.

In certain embodiments, and as shown with respect to the example embodiment illustrated by FIGS. 1A-1C, the first portion 143 is positionable such that the first segment 120 is between the first portion 143 and the first side 112 of the module 110. In certain other embodiments, the first portion 143 is positionable between the first segment 120 and the first side 112 of the module 110. Similarly, in some embodiments, and as shown with respect to the example embodiment illustrated by FIGS. 1A-1C, the second portion 145 is positionable such that the second segment 130 is between the second portion 145 and the second side 116 of the module 110. In certain other embodiments, the second portion 145 is positionable between the second segment 130 and the second side of the module 110.

Figure 6:
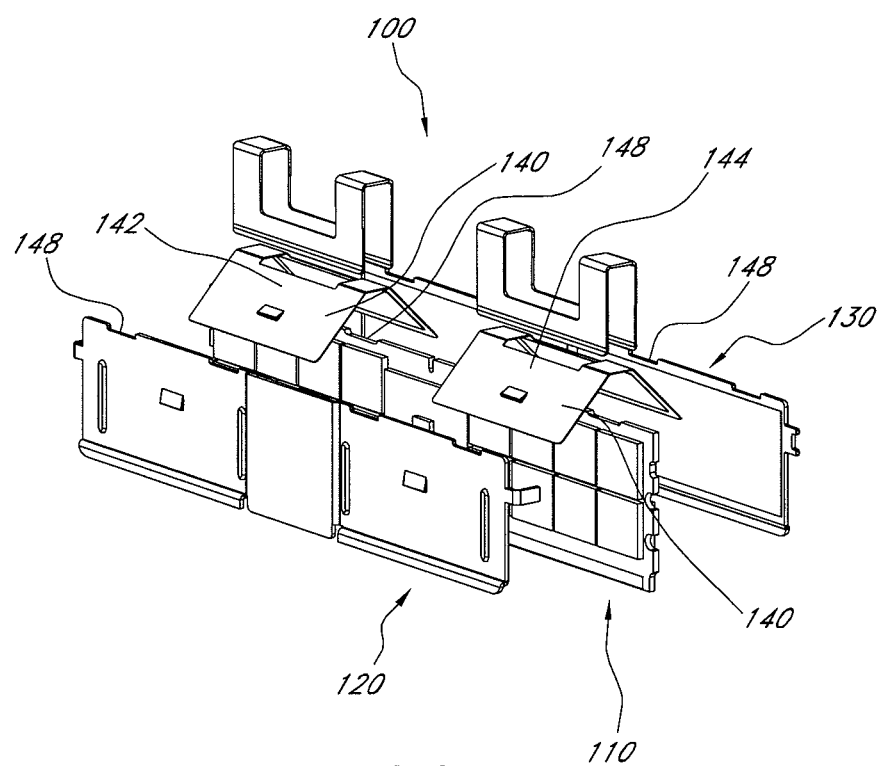
FIG. 6 schematically illustrates an exploded view of another heat dissipation system compatible with certain embodiments described herein.
Figure 7A:
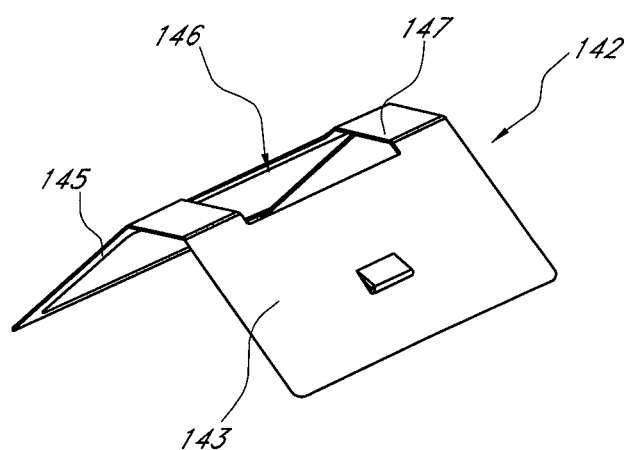
FIGS. 7A-7C schematically illustrate various views of another example third segment of the heat dissipation system compatible with certain embodiments described herein.
Figure 7B:
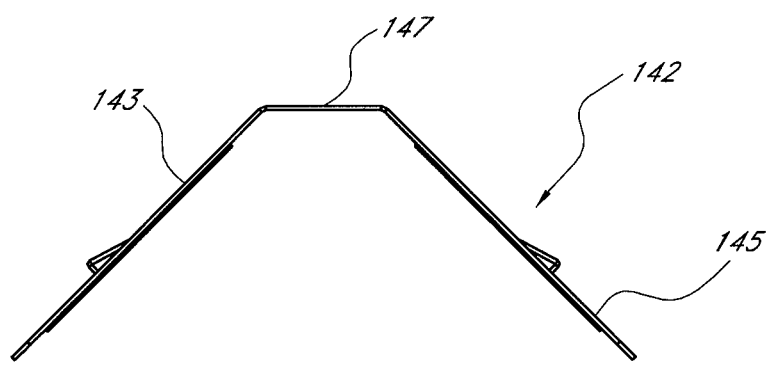
Figure 7C:
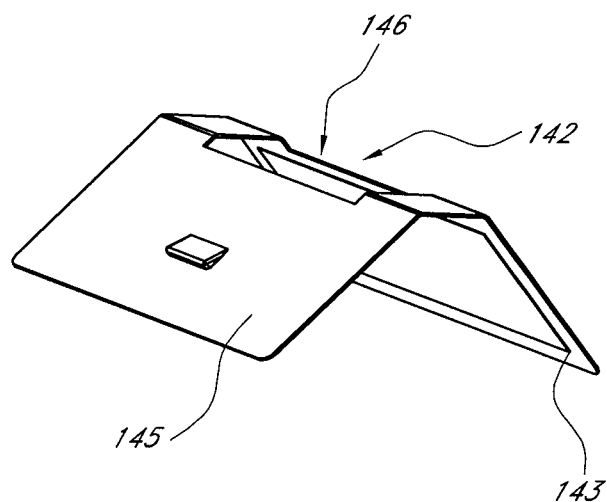

In certain other embodiments, the third segment 140 comprises a plurality of elements in a configuration as described herein. For example, FIG. 6 schematically illustrates an exploded view of another heat dissipation system 100 compatible with certain embodiments described herein having a third segment 140 which comprises two elements 142, 144. In the illustrated embodiment, the two elements 142, 144 are similar to one another. In certain other embodiments, the elements may be shaped differently from one another and/or there may be more than two elements. For example, in certain embodiments, one or more of the elements may be shaped to accommodate or be accommodated by certain parts of the module 110, the first segment 120, and/or the second segment 130. FIGS. 7A-7C schematically illustrate various views of one element 142 of the third segment 140 of the heat dissipation system 100 of FIG. 6 in accordance with certain embodiments described herein. As shown with respect to FIGS. 7A-7C, the third segment 140 can comprise one or more holes or cut-outs 146. The cut-outs 146 can be shaped, in certain embodiments, so as to be accommodated by one or more features on, for example, the module 110, the first segment 120, and/or the second segment 130 (e.g., FIG. 6). For example, the cut-out 146 of the element 142 of the third segment 140 of FIGS. 7A-7C can be shaped such that the element 142 is accommodated by one or more notches 148 on the module 110, the first segment 120, and/or the second segment 130. In certain embodiments, the cut-outs 146 and the corresponding features they accommodate, such as the notches 148, are configured so as to provide a flush surface, such as a flush top edge when the heat dissipation system 100 is assembled on the module. In certain embodiments, the cut-out 146 and notch 148 arrangement is configured to limit the overall height of the heat dissipation system 100 and module 110 assembly. In certain embodiments, the limited height allows the module 110 with the mounted heat dissipation system 100 to conform to certain height requirements so as to, for example, fit to certain form factors and/or to meet certain industry standards (e.g., a JEDEC standard). In certain embodiments, the combined height of the module 110 and the heat dissipation system 100 assembly is about 18.3 millimeters. In other embodiments, the combined height is about 30 millimeters. In various embodiments, the combined height may be between about 18.3 millimeters to about 30 millimeters. Shorter or taller combined heights are possible in other configurations in accordance with certain embodiments described herein.

In certain embodiments, a thermally conductive material (not shown) is positionable between the first segment 120 and the third segment 140 to improve thermal conductivity between the first segment 120 and the third segment 140. In certain embodiments, a thermally conductive material (not shown) is positionable between the second segment 130 and the third segment 140 to improve thermal conductivity between the second segment 130 and the third segment 140. In certain embodiments, the thermally conductive material between the first segment 120 and the third segment 140 comprises the same material as the thermally conductive material between the second segment 130 and the third segment 140. In other embodiments, different thermally conductive materials are used. The thermally conductive material between the first segment 120 and the third segment 140 and/or the thermally conductive material between the second segment 130 and the third segment 140 can comprise appropriate materials and which would be within the knowledge of those of skill in the art. Examples of such materials are described herein.

In certain embodiments, a thermally conductive material (not shown) is positionable between the first portion 143 and the at least one of the first plurality of electronic components 114 to improve thermal conductivity between the first portion 143 and the at least one of the first plurality of electronic components 114. In certain embodiments, a thermally conductive material (not shown) is positionable between the second portion 145 and the at least one of the second plurality of electronic components 118 to improve thermal conductivity between the second portion 145 and the at least one of the second plurality of electronic components 118. The thermally conductive material may be, for example, one of the thermally conductive materials described herein.

In certain embodiments, and as shown with respect to FIGS. 1A-1C and 5A-5C above, the first portion 143 is positionable to be in thermal communication with the advanced memory buffer 117. In certain embodiments, a thermally conductive material is positionable between the first portion 143 and the advanced memory buffer 117 to improve thermal conductivity between the first portion 143 and the advanced memory buffer 117.

In certain embodiments, the third segment 140 comprises at least one securing feature 141 which mechanically mates with at least one corresponding securing feature 121, 131 on at least one of the first segment 120 and/or the second segment 130. In some embodiments, and as shown in the example embodiments of FIGS. 1A-1C and FIGS. 3A-5C, the at least one securing feature 141 of the third segment 140 comprises a recess and the at least one corresponding securing feature 121, 131 on the at least one of the first segment 120 and/or the second segment 130 comprises a protrusion. In other embodiments, other types of securing features may be used such as a friction mechanism. In certain other embodiments, the securing features may be generally reversed. For example, in certain embodiments, the recess may be included on the first segment 120 and/or second segment 130 while the protrusion may be included on the third segment 140.

In certain embodiments, and as shown with respect to FIGS. 1A-1C above, the first segment 120, the second segment 130, and the third segment 140 can comprise separate elements which are detachable from one another. In yet other embodiments, the first segment 120, the second segment 130, and the third segment 140 together comprise a single integral element. In certain embodiments, other configurations are possible. For example, the first and second segments 120, 130 may comprise a single integral element and the third segment 140 may comprise a separate integral element.

The module 110 of certain embodiments has a length and a height and the first segment 120 extends substantially along the full length and the full height of the module 110. In certain embodiments, the second segment 130 extends substantially along the full length and the full height of the module 110.

In some embodiments, the first, second and third segments 120, 130, 140 may comprise different materials from one another. For example, in one embodiment, the first and second segments 120, 130 comprise aluminum and the third segment 140 comprises copper. In certain other embodiments, the first, second and third segments 120, 130, 140 may comprise the same material.

Figure 8:
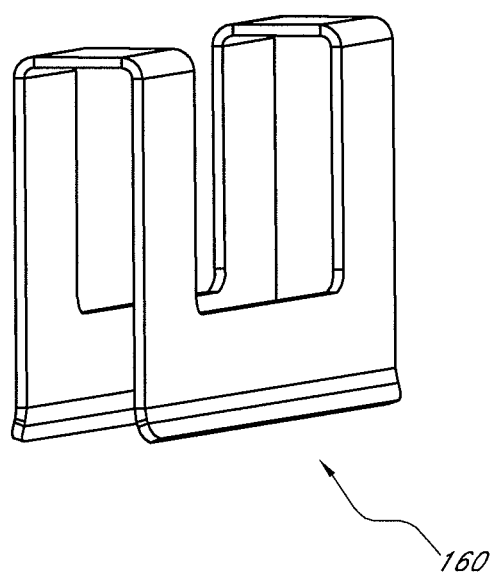
FIG. 8 schematically illustrates an example fastener compatible with certain embodiments described herein.

In certain embodiments, the heat dissipation system 100 further comprises one or more fasteners 160 (e.g., clips) mountable on the first segment 120, the second segment 130, and/or the third segment 140. The fasteners 160 of certain embodiments apply force to one or more of the first segment 120, the second segment 130, and the third segment 140 so that the first segment 120, the second segment 130, and the third segment 140 are mechanically coupled to the module. In certain embodiments the fasteners 160 can comprise metal such as, for example, stainless steel. In other embodiments, the fasteners 160 comprise other materials such as, for example, plastic. FIG. 8 schematically illustrates an example fastener 160 compatible with certain embodiments described herein. The fastener 160 has a general "U"-shape which fits over respective portions of one or more of the first segment 120, the second segment 130, and the third segment 140. The fastener 160 provides a tension spring force which holds the first segment 120 and the second segment 130 in place on either side 112, 116 of the module 110. In certain embodiments, the fastener 160 comprises one or more protrusions (not shown). These protrusions can mate with corresponding recesses on one or more of the first segment 120, the second segment 130, and the third segment 140 thereby advantageously increasing the stability of the heat dissipation system 100. In certain other embodiments, the fasteners 160 comprise recesses which mate with corresponding protrusions on one or more of the first segment 120, the second segment 130, and the third segment 140. Certain embodiments of the fastener 160 include a cut-out portion. The fastener 160 may be designed so as to accommodate one or more notches 148 on the memory module 110 and/or other features of the heat dissipation system 100. In other embodiments, the fastener 160 may not include a cut-out portion. FIGS. 1A-1C schematically illustrate an exploded view of an example configuration of fasteners 160 with the first segment 120, the second segment 130, the third segment 140, and the module 110. Other configurations of fasteners 160 or other structures for holding the portions of the heat dissipation system 100 on the module 110 are also compatible with certain embodiments described herein. For example, in certain embodiments, adhesives can be used as fasteners 160 to bond the portions of the heat dissipation system 100 together with the module 110.

Figure 9A:
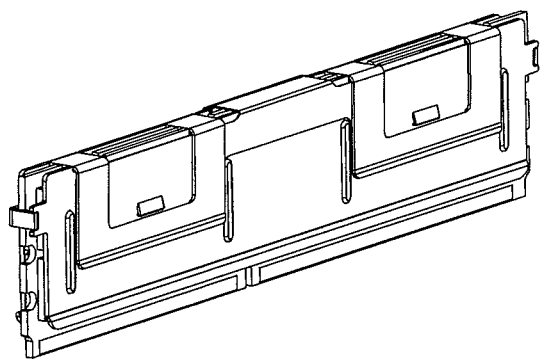
FIGS. 9A-9B schematically illustrate various views of an example assembled heat dissipation system on a module in accordance with certain embodiments described herein.
Figure 9B:
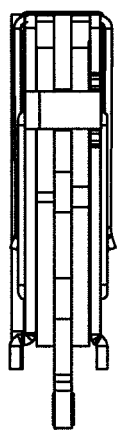
Figure 10:
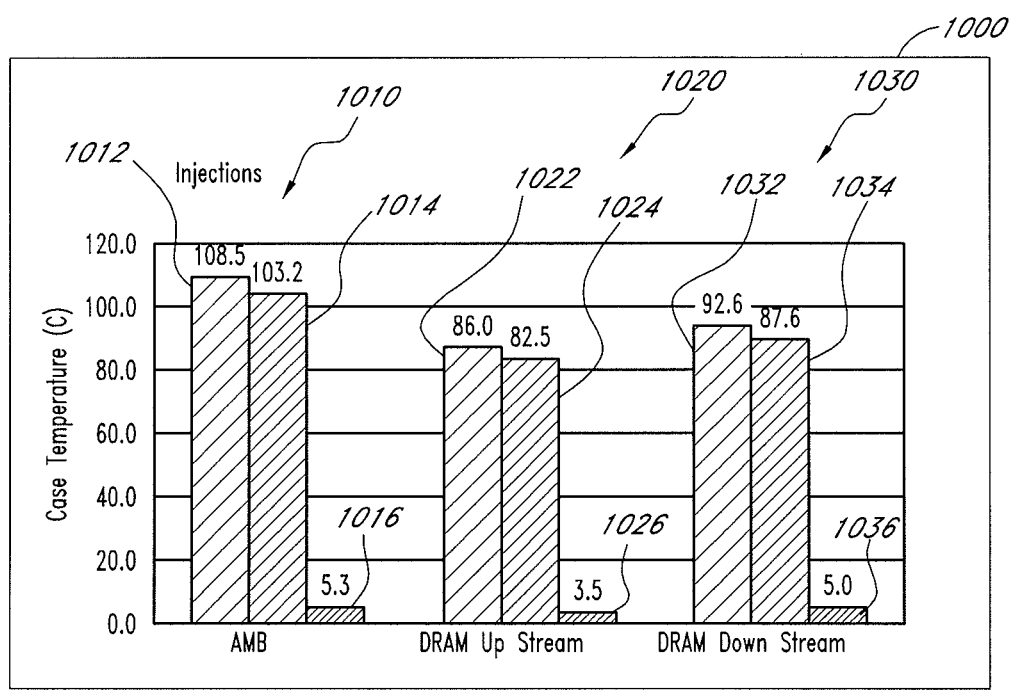
FIG. 10 is a bar graph illustrating the results of a simulation comparing the temperatures of the DRAM devices and one AMB of an FBDIMM with (i) a conventional heat dissipation system; and (ii) a heat dissipation system compatible with embodiments described herein.

FIGS. 9A-9B schematically illustrate various views of an example assembled heat dissipation system 100 on the module 110 in accordance with certain embodiments described herein. The heat dissipation system 100 advantageously provides superior removal of heat from the module 110. FIG. 10 is a bar graph 1000 illustrating the results of a simulation comparing the temperatures of the DRAM devices and the AMB of an FBDIMM with (i) a conventional heat dissipation system; and (ii) a heat dissipation system compatible with embodiments described herein. Temperature comparisons are shown for the AMB, a DRAM upstream with respect to the direction of air flow, and a DRAM downstream with respect to the direction in which air flows. The temperature difference (DeltaT) 1016, 1026, 1036 between the conventional heat dissipation system 1012, 1022, 1032 and the heat dissipation system 1014, 1024, 1034 compatible with embodiments described herein is also illustrated in the bar graph for each of the three types of characterized devices (AMB, upstream DRAM, and downstream DRAM). In certain embodiments, the FBDIMM is an 8 GB FBDIMM operating at 667 MHz. FIG. 10 illustrates that in certain embodiments the heat dissipation system 100 provides significantly improved cooling over conventional heat spreaders. For example, the heat dissipation system 100 of certain embodiments can provide temperatures which are between about 5 degrees Celsius and about 7 degrees Celsius lower than temperatures provided by conventional heat dissipation systems.

Figure 11:
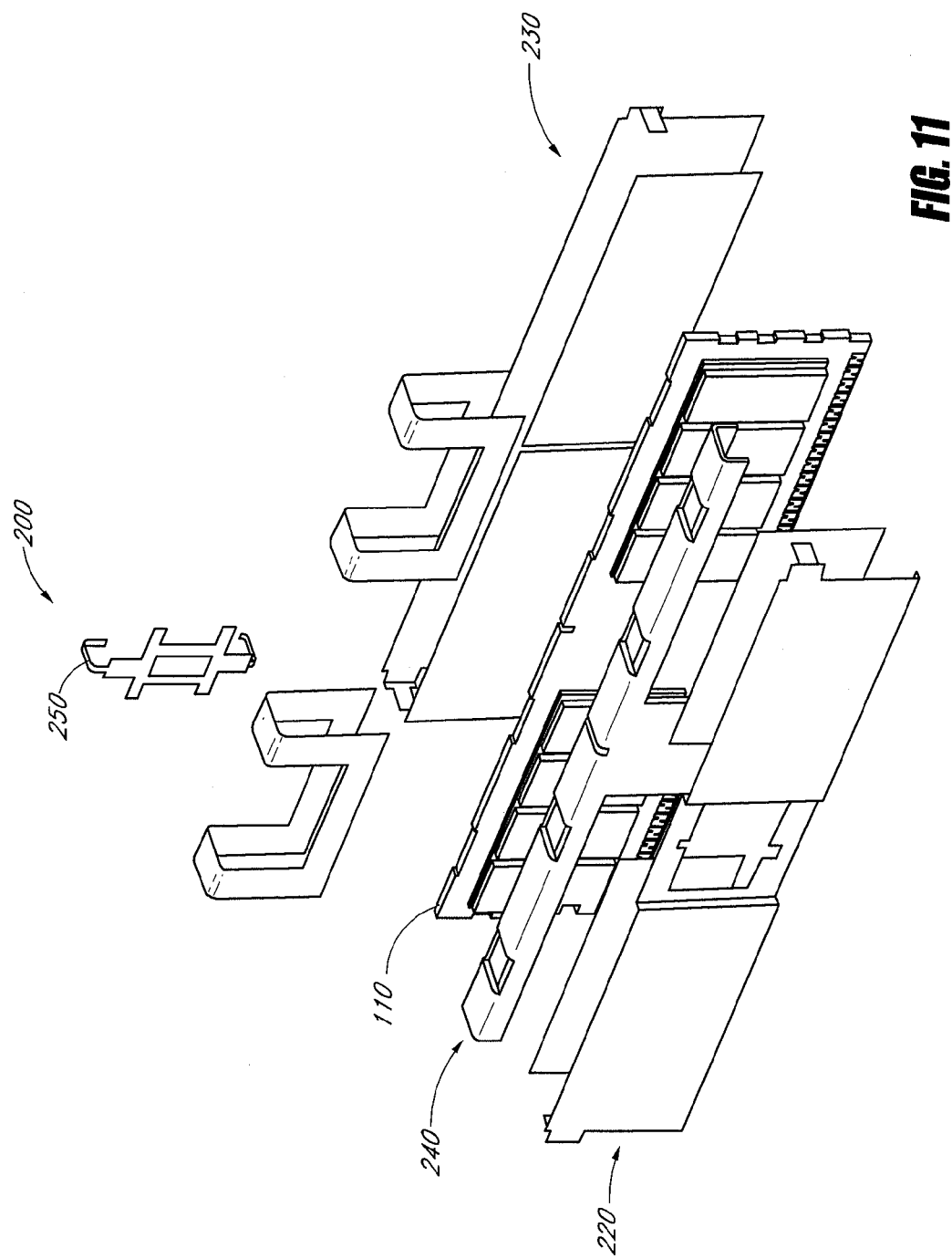
FIG. 11 schematically illustrates an exploded view of another heat dissipation system compatible with certain embodiments described herein.

FIG. 11 schematically illustrates an exploded view of another heat dissipation system 200 compatible with certain embodiments described herein. The heat dissipation system 200 is designed for use with an electronic module 110 having a first side 112 with a first plurality of electronic components 114 mounted thereon and a second side 116 with a second plurality of electronic components 118 mounted thereon. The heat dissipation system 100 comprises a first segment 220 mountable on the module 110 to be in thermal communication with at least one electronic component of the first plurality of electronic components 114. The heat dissipation system 100 further comprises a second segment 230 mountable on the module 110 to be in thermal communication with at least one electronic component of the second plurality of electronic components 118. The heat dissipation system 100 also comprises a third segment 240 mountable on the module 110 to be in thermal communication with the first segment 220 and with the second segment 230. In certain embodiments, the third segment 240 provides a path through which heat flows from the first segment 220 to the second segment 230. In certain embodiments, the third segment 240 comprises a portion 242 in thermal communication with at least one electronic component of the first plurality of electronic components 114 as described below with respect to FIGS. 13A-13E.

FIGS. 12A-12D schematically illustrate various views of another example first segment 220 of the heat dissipation system 200 of FIG. 11 compatible with certain embodiments described herein. The first segment 220 may also be referred to as a heat spreader. The first segment 220 of certain embodiments comprises a thermally conductive material (e.g., metals, copper, aluminum, copper alloy, aluminum alloy, metal matrix composites, carbon composites). In certain embodiments, the first segment 220 comprises a single integral element or piece of material which is formed into a configuration as described herein. For example, the first segment 220 can be formed from a single sheet of metal shaped (e.g., cut, bent, or both cut and bent) into a configuration as described herein. Various ranges of thicknesses of the sheet are compatible with certain embodiments described herein, including but not limited to between 0.3 millimeter and 3 millimeters, between 0.3 millimeter and 1 millimeter, between 0.35 millimeter and 1 millimeter, and between 0.3 millimeter and 0.7 millimeter. Higher or lower thicknesses are possible in other configurations in accordance with certain embodiments described herein. In certain other embodiments, the first segment 220 comprises a plurality of elements which are connected together in a configuration as described herein.

In certain embodiments, the heat dissipation system 200 further comprises a thermally conductive material (not shown) positionable between the first segment 220 and the first plurality of electronic components 114 to improve thermal conductivity between the first segment 220 and the first plurality of electronic components 114. The thermally conductive material improves the thermal conductivity between the first segment 220 and the electronic components. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the first segment 220 is configured to cause heat flowing from one or more electronic components on the module 110 to be at least partially thermally decoupled from one or more of the first segment 220 and the second segment 230. For example, in certain embodiments, the first segment 220 further comprises a cut-out or hole 224 which can be configured to cause heat coming from the AMB 117 on the first side 112 of the module 110 to flow generally into the third segment 240 (described below) and away from the AMB 117, before flowing into one or more of the first segment 220 and second segment 230 such that heat from the AMB 117 is dissipated across one or more of the first segment 220 and the second segment 230. In certain embodiments, for example, the AMB 117 is in direct thermal communication with the third segment 240 which is in turn in thermal communication with one or more of the first segment 220 and the second segment 230 so that heat from the AMB 117 is dissipated across one or more of the first segment 220 and the second segment 230.

The cut-out or hole 224 may, in certain embodiments, be configured to substantially thermally isolate the first segment 220 from at least one electronic component on the first side 112 of the module 110. For example, the hole 224 may be configured to substantially thermally isolate the first segment 220 from the AMB 117. In certain embodiments, the hole 224 thermally isolates the AMB 117 on the first side 112 from the memory devices on the first side 112, thereby advantageously reducing over-heating of these memory devices due to heat from the AMB 117.

In certain embodiments, the first segment 220 (or first heat spreader) comprises a first portion 222 positionable to be in thermal communication with at least one of the plurality of electronic components 114 on the first side 112 of the module 110. For example, the first portion 222 comprises a substantially flat or planar portion positionable to be in thermal communication with the first plurality of electronic components 114 on the first side 112 of the module 110. In certain embodiments, the first portion 222 is not flat or planar, but is contoured to fit with and to be in thermal communication with the first plurality of electronic components 114 mounted on the first side 112 of the module 110. The first portion 222 of certain embodiments is configured to provide heat dissipation from the one or more electronic components on the first side 112 of the module 110.

The first segment 220 of certain embodiments further comprises a second portion 226 extending along the side 112 of the module 110 and the second portion 226 is in thermal communication with the first portion 222. In certain embodiments, and as in the embodiment illustrated in FIG. 12A, the second portion 226 can be positioned such that it extends generally toward the side 112 of the module 110 when mounted on the module 110. In certain embodiments, for example, the configuration of the second portion 226 can provide improved structural integrity when the first segment 220 is mounted on the module 110. For example, the second portion 226 may prevent the first portion 222 of the first segment 220 from bending towards and/or up against the module when pressure is placed on the first portion 222 in the direction of the module 110. In certain embodiments, at least one of the plurality of electronic components 114 on the electronic module 110 is positioned between the second portion 226 and the side 112 and spaced away from the second portion 226.

The second portion 226 is configured to remove heat conducted by the first portion 222 away from the module 110. For example, the second portion 226 extends generally away from the portion 242 and provides a thermal conduit for heat from the first side 112 of the module 110 away from the module 110. In certain embodiments, the second portion 226 removes heat conducted by the first portion 222 by increasing the heat transfer area of the first segment 220. In certain embodiments, the second portion 226 extends along an edge of the module 110 having one or more connectors 113 as described above so as to provide a low profile. In certain embodiments, the second portion 226 mechanically strengthens the third segment 240.

In certain embodiments, the second portion 226 is configured so as to avoid interaction with and/or to protect components (not shown) on the first side 112 of the module 110. For example, the second portion 226 may be positioned to avoid contacting passive components such as resistors and capacitors on the side 112 of the module 110. In certain embodiments, the second portion 226 may be positioned to avoid contacting active components such as transistors on the side 112 of the module 110. In certain embodiments, the second portion 226 is configured so as to avoid physical interaction with the components. In certain embodiments, the second portion 226 is configured to avoid electrical interaction with the components. In certain embodiments, the second portion 226 is configured to avoid both physical and electrical interaction with the components.

In certain embodiments the first portion 222 and/or the second portion 226 comprises a plurality of generally planar portions. In certain embodiments, the first portion 222 is contoured to fit with and to be in thermal communication with the first plurality of electronic components 114 mounted on the first side 112 of the module 110. In certain embodiments, the second portion 226 is contoured so as to avoid interaction with one or more of the first plurality of components 114, such as one or more passive components, on the first side 112 of the module 110.

FIGS. 13A-13B schematically illustrate various views of another example second segment 230 of the heat dissipation system 200 of FIG. 11 compatible with certain embodiments described herein. The heat dissipation system 200 can include a second segment 230 mountable on the module 110 to be in thermal communication with at least one electronic component of the second plurality of electronic components 118, as illustrated in FIG. 11. The second segment 230 of certain embodiments can be similar to the second segment 130 described above with respect to FIGS. 4A-4C. In certain embodiments, the second segment 230 can be generally similar to the first segment 220 described above with respect to FIGS. 12A-12D, but may, in certain embodiments, not include a cut-out or hole 224.

In certain embodiments, the heat dissipation system 200 further comprises a thermally conductive material positionable between the second segment 230 and the second plurality of electronic components 118 which can be generally similar to the thermally conductive materials described herein.

The second segment 230 (or second heat spreader) of certain embodiments comprises a first portion 234 in thermal communication with at least one of the plurality of electronic components 118 and a second portion 236 extending along the side 116 of the module 110. The first and second portion 234, 236 can be configured to provide heat dissipation from the one or more electrical components on the second side 116 of the module 110. In certain embodiments the first and second portions 234, 236 are generally similar to the first and second portions 222, 226 described above with respect to the first segment 220. In addition, the first and second portions 234, 236 can be generally similar to the first and second portions 124, 126 described above with respect to the first segment 120 of FIGS. 3A-3C.

FIGS. 14A-14E schematically illustrate various views of another example third segment 240 of the heat dissipation system 200 of FIG. 11 compatible with certain embodiments described herein. In certain embodiments, the third segment 240 is mountable on the module 110 to be in thermal communication with one or more of the first segment 220 and with the second segment 230. In certain embodiments the third segment 240 provides a path through which heat flows from the first segment 220 to the second segment 230. In certain embodiments, the third segment 240 can comprise a thermally conductive material. In some embodiments, the third segment 240 comprises a composite material. In certain embodiments, for example, the third segment 240 comprises copper. In various embodiments, the third segment 240 comprises aluminum, copper alloy, aluminum alloy, metal matrix composites, carbon composites. In certain embodiments, the third segment 240 comprises a material that is more thermally conductive that the first segment 220 and/or second segment 230. In other embodiments, the third segment 240 can be comprised of a material that is of a similarly thermally conductive or less thermally conductive than the first segment 220 and/or the second segment 230.

In certain embodiments, the third segment 240 comprises a portion 242 in thermal communication with at least one electronic component of the first plurality of electronic components. For example, in certain embodiments, the portion 242 of the third segment 240 is in thermal communication with an advanced memory buffer 117 of the first plurality of electronic components. In other embodiments, the portion 242 of the third segment 240 may be in communication with other components of the module 110 instead of or in addition to the AMB 117. In certain embodiments, the portion 242 of the third segment 240 is substantially flat or planar. In certain embodiments, the third segment 240 comprises a substantially flat or planar portion 244 running substantially along the entire length of the edge of the module 110. As discussed, in certain embodiments, the first segment 220 comprises a hole 224. At least a portion of the third segment 240 is mountable over the hole 224 in certain embodiments. For example, in certain embodiments, at least one electronic component of the first plurality of electronic components 114 (e.g., the AMB 117) can extend through the hole 224 of the first segment 220 to be in thermal communication and/or direct physical contact with the portion 242 of the third segment 240.

In certain embodiments, the third segment 240 extends from the first segment 220 over or across an edge of the module 110 to the second segment 230. In certain embodiments, the third segment 240 extends over or across the top (e.g., non-connector) side of the module. In some embodiments, the third segment 240 extends over or across multiple edges or different edges of the module 110, such as, for example, one or more sides of the module 110. In certain embodiments, the third segment 240 extends over or across only a portion of an edge of the module 110, such as a center portion of an edge of the module 110. In other embodiments, the third segment 240 extends over or across substantially an entire edge of the module 110.

In certain embodiments, the third segment 240 comprises a single integral element or piece of material which is formed into a configuration as described herein. For example, the third segment 240 can be formed from a single sheet of metal shaped (e.g., cut, bent, or both cut and bent) into a configuration as described herein. Various ranges of thicknesses of the sheet are compatible with certain embodiments described herein, including but not limited to between 0.3 millimeter and 3 millimeters, between 0.3 millimeter and 1 millimeter, between 0.35 millimeter and 1 millimeter, and between 0.3 millimeter and 0.7 millimeter. Higher or lower thicknesses are possible in other configurations in accordance with certain embodiments described herein. In certain other embodiments, the third segment 240 comprises a plurality of elements which can be connected together.

In certain embodiments, the third segment 240 may be shaped to accommodate certain parts of the module 110, the first segment 220, and/or the second segment 230. For example, the third segment 240 can comprise one or more holes or cut-outs 246. The cut-outs 246 can be shaped, in certain embodiments, so as to be accommodated by one or more features on, for example, the module 110, the first segment 220, and/or the second segment 230. For example, the cut-outs 246 can be shaped to such that the element 240 is accommodated by one or more notches on the module 110, the first segment 220, and the second segment 230. In certain embodiments, the cut-outs 246 and the corresponding features they are accommodated by, such as the notches, are configured so as to provide a flush surface, such as a flush top edge when the heat dissipation system 200 is assembled on the module.

Figure 15:
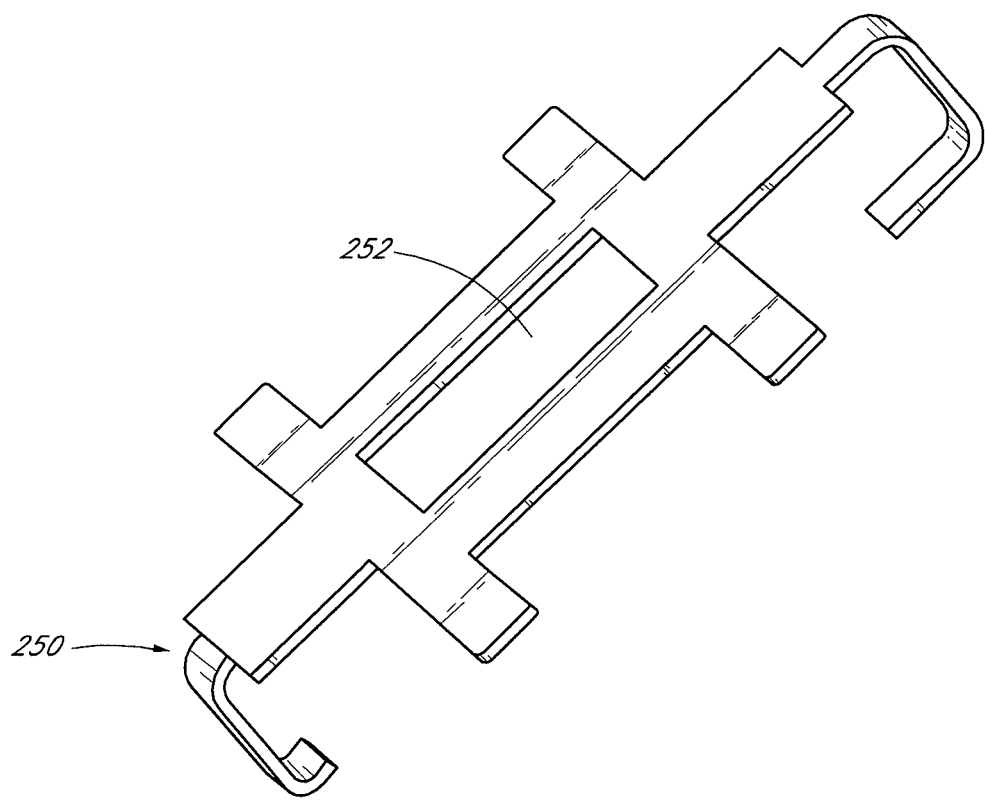
FIG. 15 schematically illustrates an example fastener of the heat dissipation system of FIG. 11 compatible with certain embodiments described herein.

FIG. 15 schematically illustrates an example fastener 250 of the heat dissipation system 200 of FIG. 11 compatible with certain embodiments described herein. A fastener 250 may be mountable on the third segment 240 to apply force to the third segment 240 so that the third segment 240 is mechanically coupled to the module. In certain embodiments, the fastener comprises a cut-out portion 252. In certain embodiments, for example, the cut-out portion 252 provides for enhanced heat removal from one or more of the electronic components on the module 110. For example, in certain embodiments, the cut-out portion 252 provides for enhanced heat removal from the AMB 117 on the module 110. The cut-out portion 252 of certain embodiments reduces the thermal resistance from the one or more electronic components (e.g., the AMB 117) to the third segment 240 and/or to one or more other portions of the heat dissipation system 200 such as the first segment 220 or the second segment 230. In certain embodiments, the fastener is made of metal, such as, for example, stainless steel.

Figure 16:
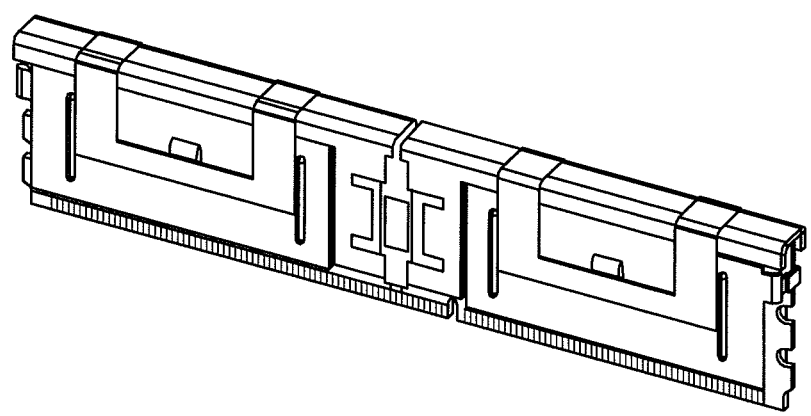
FIG. 16 schematically illustrates an assembled heat dissipation system of FIG. 11 on the module in accordance with certain embodiments described herein.
Figure 17:
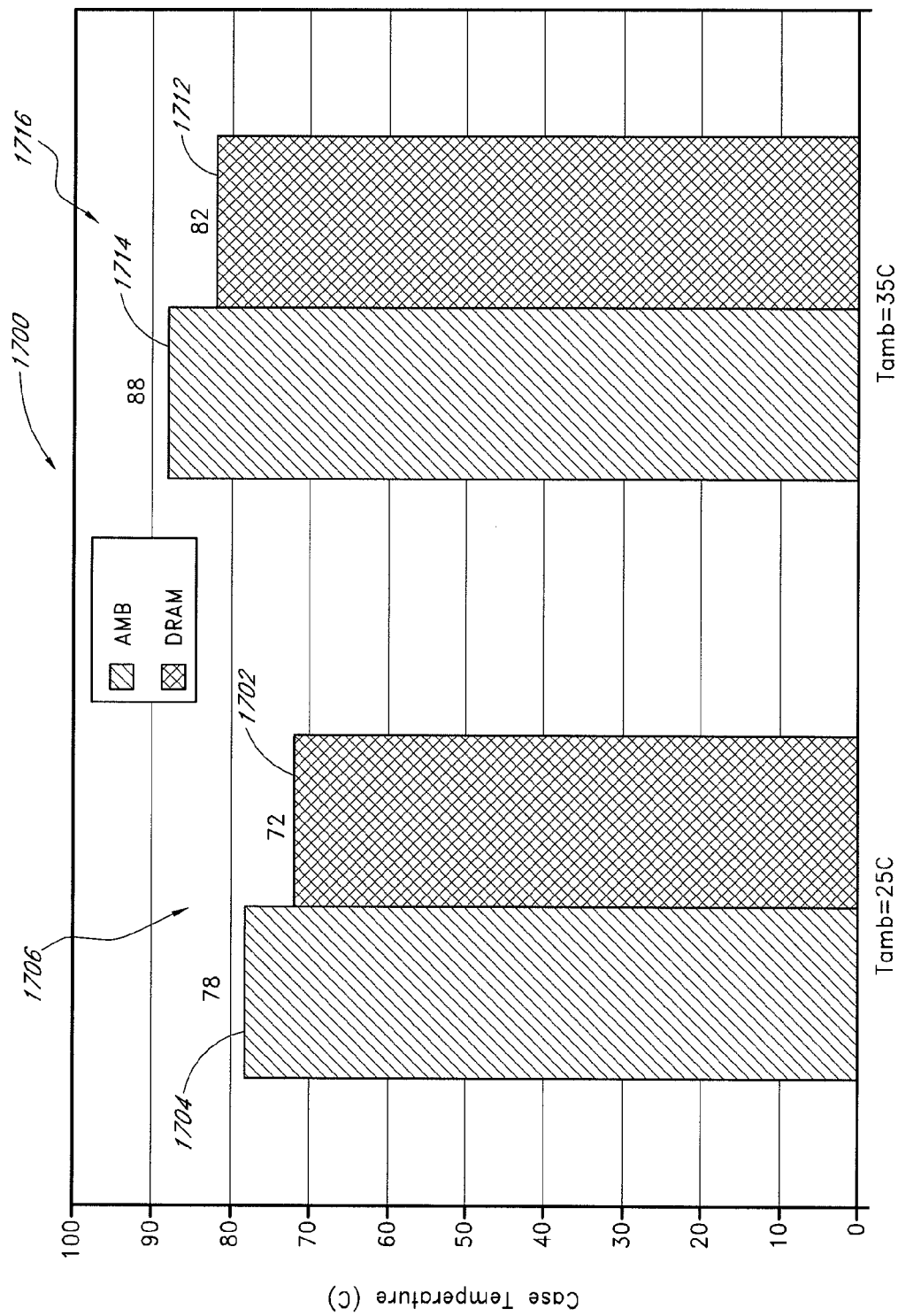
FIG. 17 is a bar graph illustrating the results of a simulation comparing the temperatures of the DRAM devices and the AMB of an FBDIMM with a heat dissipation system compatible with embodiments described herein.

FIG. 16 schematically illustrates an assembled heat dissipation system 200 of FIG. 11 on the module 110 in accordance with certain embodiments described herein. FIG. 17 is a bar graph 1700 illustrating the results of a simulation comparing the temperatures of the DRAM devices 1702, 1712 and the AMB 1704, 1714 of an FBDIMM with a heat dissipation system compatible with embodiments described herein. Results 1706, 1716 in degrees Celsius are shown for simulation results corresponding to ambient temperatures of 25 degrees Celsius and 35 degrees Celsius, respectively. As shown, at 25 degrees Celsius the temperature of the AMB 1704 is about 78 degrees Celsius and the temperature of the DRAM devices 1702 is about 72 degrees Celsius. At 35 degrees Celsius, the temperature of the AMB 1714 is about 88 degrees Celsius and the temperature of the DRAM devices 1712 is about 82 degrees Celsius.

Figure 18:
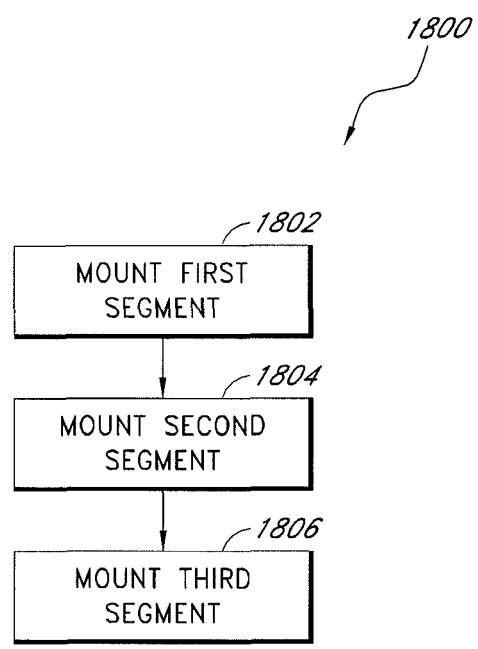
FIG. 18 is a flow chart of an example method of thermally coupling a heat dissipation system to an electronic module in accordance with certain embodiments described herein.

FIG. 18 is a flow chart of an example method 1800 of thermally coupling a heat dissipation system 100 to an electronic module 110 in accordance with certain embodiments described herein. Although described with respect to the heat dissipation 100, the method 1800 may be compatible with any of the heat dissipation systems described herein or with some other heat dissipation system. The electronic module 110 of certain embodiments has a first side 112 with a first plurality of electronic components 114 mounted thereon and a second side 116 with a second plurality of electronic components 118 mounted thereon. The method 1800 of certain embodiments comprises mounting a first segment 120 on the module 112 to be in thermal communication with at least one electronic component of the first plurality of electronic components 114 at operational block 1802. In certain embodiments, the method 1800 further comprises mounting a second segment 130 on the module 112 to be in thermal communication with at least one electronic component of the second plurality of electronic components 118 at operational block 1804. At operational block 1806, the method 1800 may comprise mounting a third segment 140 on the module 112 to be in thermal communication with the first segment 112 and with the second segment 130, the third segment 140 providing a path through which heat flows from the first segment 120 to the second segment. In certain embodiments, the method 1800 further comprises mounting a fastener 160 on the module 110. The fastener 160 of certain embodiments is configured to apply force to one or more of the first segment 120, the second segment 130, and the third segment 140 so that the first segment 120, the second segment 130, and the third segment 140 are mechanically coupled to the module.

In certain embodiments, one or more of the first segment 120, the second segment 130, and the third segment 140 are reversibly or removably mounted on the module 112 such that the respective segments 120, 130, 140 are removable from the module 112 without appreciably damaging the module 112. One or more of the operational blocks 1802, 1804, 1806 shown in FIG. 18 may not be included in certain other embodiments. In yet other embodiments, one or more additional operational blocks may be included in addition to, or instead of the operational blocks 1802, 1804, 1806 of FIG. 18.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A heat dissipation system for use with an electronic module having a first side with a first plurality of electronic components and a second side with a second plurality of electronic components, the heat dissipation system comprising:

a first segment configured to be in thermal communication with at least one electronic component of the first plurality of electronic components;

a second segment configured to be in thermal communication with at least one electronic component of the second plurality of electronic components;

a third segment configured to be in thermal communication with the first segment and with the second segment, the third segment providing a path through which heat flows from the first segment to the second segment; and a fastener configured to apply force to one or more of the first segment, the second segment, and the third segment so that at least a portion of the third segment is between the fastener and one or more of the first segment and the second segment.

2. The method of claim 1, wherein the first segment, second segment, and the third segment are configured to be reversibly or removably mounted on the module.

3. The heat dissipation system of claim 1, wherein the module comprises a fully-buffered dual-inline memory module, the first plurality of electronic components comprises a first plurality of memory devices and an advanced memory buffer, and the second plurality of electronic devices comprises a second plurality of memory devices.

4. The heat dissipation system of claim 1, wherein the module comprises a registered dual in-line memory module (DIMM) or a rank-buffered DIMM.

5. The heat dissipation system of claim 1, wherein at least one of the first segment and the second segment comprises a substantially flat portion configured to be in thermal communication with at least one electronic component, and wherein the substantially flat portion has a thicknesses between 0.3 millimeter and 3 millimeters, and wherein the electronic module with the heat dissipation system mounted thereon is between about 3.4 millimeters to about 7.55 millimeters thick.

6. The heat dissipation system of claim 5, wherein the at least one of the first segment and the second segment further comprises a contoured portion extending along a side of the electronic module having one or more connectors, the contoured portion removing heat conducted by the flat portion.

7. The heat dissipation system of claim 1, wherein the fastener comprises a cut-out portion.

8. The heat dissipation system of claim 1, wherein the third segment comprises a first portion positionable to be in thermal communication with the first segment, a second portion positionable to be in thermal communication with the second segment, and a third portion which connects the first and second portions.

9. The heat dissipation system of claim 1, wherein the first, second and third segments each comprises a single integral element, and wherein the first segment, the second segment, and the third segment are separate elements that are detachable from one another and from the fastener.

10. The heat dissipation system of claim 1, wherein the third segment comprises at least one securing feature which mechanically mates with at least one corresponding securing feature on at least one of the first segment and the second segment.

11. The heat dissipation system of claim 1, the third segment extending from the first segment over or across an edge of the module to the second segment.

12. The heat dissipation system of claim 1, wherein the third segment comprises a thermally conductive material that is more thermally conductive than at least the first segment.

13. The heat dissipation system of claim 8, wherein the first plurality of electronic components includes at least one first electronic component, the at least one first electronic component capable of dissipating a relatively large amount of heat in comparison to other electronic components on the electronic module, and wherein the first portion of the third segment is positionable to be above the at least one first electronic component of the first plurality of electronic components so as to efficiently draw heat from the at least one first electronic component.

14. The heat dissipation system of claim 1, wherein a thickness of the third segment is between 0.3 millimeter and 1 millimeter.

15. The heat dissipation system of claim 8, wherein the first portion is smaller in size than the second portion.

16. The heat dissipation system of claim 12, wherein the third segment comprises copper.

\* \* \* \* \*